(12) United States Patent
Ishikawa et al.

(10) Patent No.: US 8,450,139 B2
(45) Date of Patent: May 28, 2013

(54) METHOD FOR MANUFACTURING PHOTOELECTRIC CONVERSION DEVICE

(75) Inventors: Yasuaki Ishikawa, Osaka (JP); Shinya Honda, Osaka (JP); Makoto Higashikawa, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/318,259

(22) PCT Filed: Apr. 28, 2010

(86) PCT No.: PCT/JP2010/057553
§ 371 (c)(1),
(2), (4) Date: Oct. 31, 2011

(87) PCT Pub. No.: WO2010/126080
PCT Pub. Date: Nov. 4, 2010

(65) Prior Publication Data
US 2012/0052619 A1    Mar. 1, 2012

(30) Foreign Application Priority Data

Apr. 30, 2009    (JP) ................................ 2009-110662

(51) Int. Cl.
*H01L 31/18*    (2006.01)
(52) U.S. Cl.
USPC ...... 438/89; 438/485; 438/488; 438/E31.013; 136/255; 136/256; 136/258
(58) Field of Classification Search
USPC ............. 438/96–97, 482, 485–488, E31.013, 438/E31.32; 136/255–256, 257, 258
See application file for complete search history.

(56) References Cited

U.S. PATENT DOCUMENTS

| | | | |
|---|---|---|---|
| 5,618,758 A | 4/1997 | Tomita et al. | |
| 6,009,828 A | 1/2000 | Tomita et al. | |
| 6,180,870 B1 | 1/2001 | Sano et al. | |
| 6,265,288 B1* | 7/2001 | Okamoto et al. | 438/485 |
| 6,399,873 B1 | 6/2002 | Sano et al. | |
| 2002/0014625 A1 | 2/2002 | Asami et al. | |
| 2003/0079771 A1 | 5/2003 | Sano et al. | |
| 2003/0213515 A1 | 11/2003 | Sano et al. | |
| 2004/0169177 A1 | 9/2004 | Asami et al. | |
| 2005/0028860 A1 | 2/2005 | Sano et al. | |
| 2006/0246638 A1 | 11/2006 | Asami et al. | |
| 2009/0183771 A1* | 7/2009 | Sannomiya et al. | 136/258 |

FOREIGN PATENT DOCUMENTS

| | | |
|---|---|---|
| JP | 5-156451 | 6/1993 |
| JP | 6-85292 | 3/1994 |
| JP | 6-291045 | 10/1994 |
| JP | 7-37818 | 2/1995 |
| JP | 7-183550 | 7/1995 |

(Continued)

OTHER PUBLICATIONS

International Search Report for PCT/JP2010/057553, mailed Jul. 6, 2010.

*Primary Examiner* — Dung A. Le
(74) *Attorney, Agent, or Firm* — Nixon & Vanderhye, P.C.

(57) ABSTRACT

A method for manufacturing a photoelectric conversion device including a forming a semiconductor film by a plasma CVD method. The semiconductor film is an amorphous film of SiGe-based compound or a microcrystalline film of SiGe-based compound. The plasma CVD controls bandgap in thickness direction of the semiconductor film by varying the ON or OFF time of electric power applied to generate a plasma and intermittently supplying the power. The ON time and OFF time of the power fall in a range where the duty ratio ON time/(ON time+OFF time)×100(%) is 10% or more and 50% or less.

5 Claims, 7 Drawing Sheets

FOREIGN PATENT DOCUMENTS

| | | |
|---|---|---|
| JP | 8-222520 | 8/1996 |
| JP | 10-88358 | 4/1998 |
| JP | 10-125944 | 5/1998 |
| JP | 11-243218 | 9/1999 |
| JP | 11-298004 | 10/1999 |
| JP | 2002-124685 | 4/2002 |
| JP | 2002-270875 | 9/2002 |
| JP | 2003-197536 | 7/2003 |

* cited by examiner

FIG.2
(a)
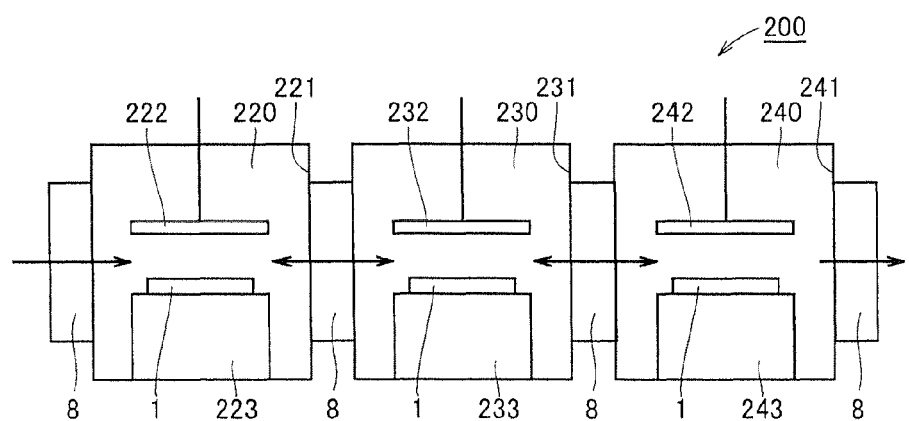
(b)
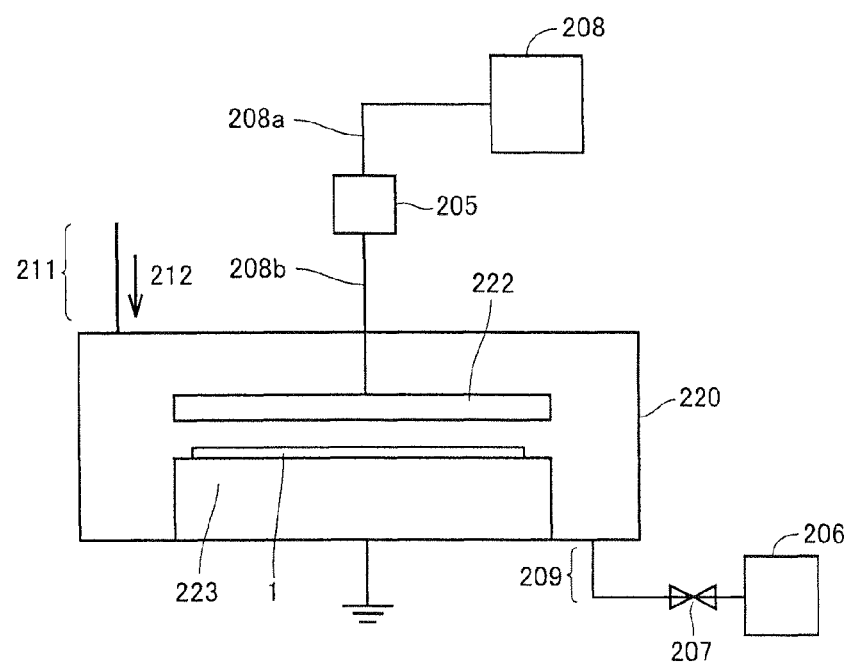

FIG.3
(a)
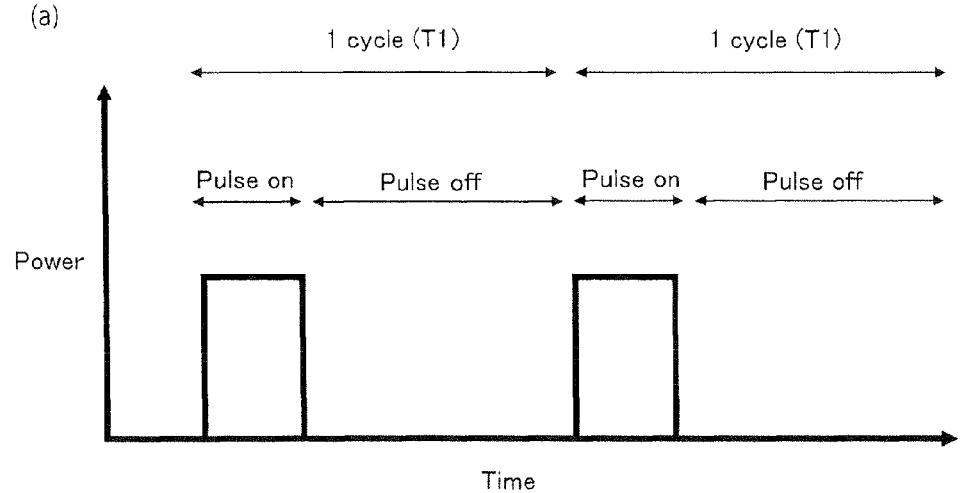
(b)
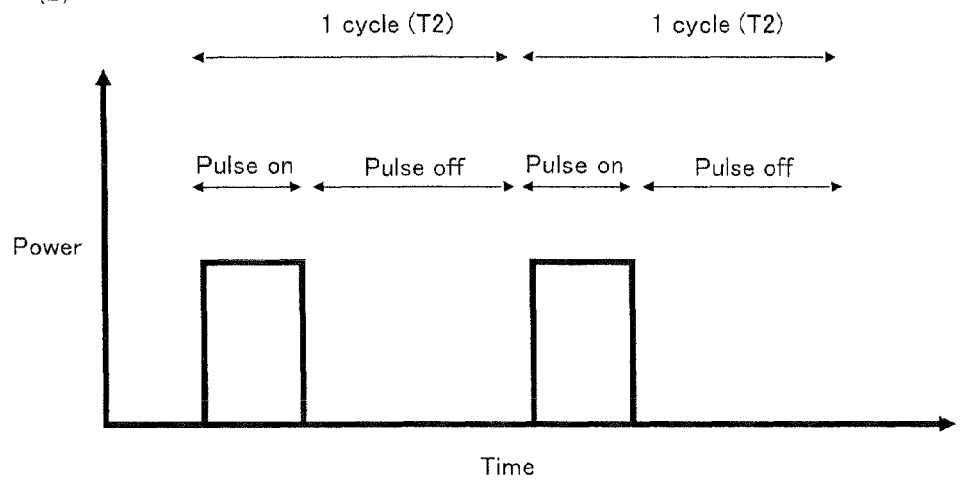

METHOD FOR MANUFACTURING PHOTOELECTRIC CONVERSION DEVICE

This application is the U.S. national phase of International Application No. PCT/JP2010/057553, filed 28 Apr. 2010, which designated the U.S. and claims priority to JP Application No. 2009-110662, filed 30 Apr. 2009, the entire contents of each of which are hereby incorporated by reference.

TECHNICAL FIELD

The technology disclosed herein relates to methods for manufacturing a semiconductor film and a photoelectric conversion device including the semiconductor film.

BACKGROUND ART

Recently, thin-film photoelectric conversion devices formed from gases by a plasma CVD method have been of interest. Examples of such thin-film photoelectric conversion devices include silicon-based thin-film photoelectric conversion devices made up of silicon-based thin films, thin-film photoelectric conversion devices made of a CIS compound ($CuInSe_2$) and a CIGS compound ($Cu(In,Ga)Se_2$), and the like. Development of the photoelectric conversion devices is being promoted and the production thereof is being increased. These photoelectric conversion devices have the following characteristic. On a large-area and low-cost substrate, semiconductor layers or metal electrode films are stacked by a film deposition apparatus such as plasma CVD apparatus or sputtering apparatus, and thereafter photoelectric conversion devices fabricated on the same substrate are separated and connected by laser patterning to thereby hold a possibility of enabling both lower cost and higher performance of the photoelectric conversion devices to be achieved.

One of the structures of such thin-film photoelectric conversion devices is a stack-type photoelectric conversion device structure that can effectively utilize incident light. The stack-type photoelectric conversion device structure refers to a structure in which a plurality of photoelectric conversion layers receive respective portions of an incident light spectrum. These photoelectric conversion layers use semiconductor materials having respective forbidden band widths suitable for absorbing respective wavelength bands of the incident light, and are stacked, from the light incident side, in the order that a layer of a larger forbidden band width is followed by a layer of a smaller forbidden band width. In this stack-type photoelectric conversion device structure, light of a shorter wavelength is absorbed by a photoelectric conversion layer of a larger forbidden band width, and light of a longer wavelength is absorbed by a photoelectric conversion layer of a smaller forbidden band width. Thus, as compared with a photoelectric conversion device having only one photoelectric conversion layer, the stack-type photoelectric conversion device enables solar light of a wider wavelength range to contribute to photoelectric conversion, and thereby enable the photoelectric conversion efficiency to be improved.

Japanese Patent Laying-Open No. 11-243218 (hereinafter referred to as "PTL 1") discloses a stack-type photoelectric conversion device in which an amorphous silicon is used as an i-type layer of a first pin junction on the light incident side, a microcrystalline silicon is used as an i-type layer of a second pin junction, and a microcrystalline silicon is used as an i-type layer of a third pin junction. Accordingly, light can be effectively used to achieve a high photoelectric conversion efficiency and the influence of optical degradation of the i-type amorphous silicon can be reduced to improve the photoelectric conversion efficiency after optical degradation.

In addition, as a triple-junction stack-type photoelectric conversion device, a stack-type photoelectric conversion device (a-SiC/a-SiGe/a-SiGe) is known (for example, Japanese Patent Laying-Open No. 10-125944 (hereinafter referred to as "PLT 2")) in which amorphous silicon carbon is used as an i-type layer of a first pin junction on the light incident side, amorphous silicon germanium is used as an i-type layer of a second pin junction, and amorphous silicon germanium of a smaller forbidden band width than the i-type layer of the second pin junction is used as an i-type layer of a third pin junction.

For these photoelectric conversion devices, it is necessary to form semiconductor materials having respective forbidden band widths suitable for absorbing respective wavelength bands, and it is particularly necessary to manufacture a thin film of a semiconductor material with a high quality that has a narrow bandgap (forbidden band width) such as amorphous silicon germanium. Here, as a method for forming such a semiconductor material of a narrow bandgap, there is a method that varies the flow ratio between a material gas of silicon and a material gas of germanium. Further, Japanese Patent Laying-Open No. 2002-270875 (hereinafter referred to as "PTL 3") for example discloses a method for controlling the bandgap in the thickness direction of a semiconductor thin-film by varying the frequency of high-frequency electric power applied for generating a plasma for a plasma CVD method.

CITATION LIST

Patent Literature

PTL 1: Japanese Patent Laying-Open No. 11-243218
PTL 2: Japanese Patent Laying-Open No. 10-125944
PTL 3: Japanese Patent Laying-Open No. 2002-270875

SUMMARY

Technical Problem

The stack-type photoelectric conversion device disclosed in the above-referenced PTL 1, however, has the following problem. According to PTL 1, it is preferable that the amorphous silicon which is the i-type layer of the first pin junction has a film thickness of 500 to 2500 Å, the microcrystalline silicon which is the i-type layer of the second pin junction has a film thickness of 0.5 μm or more and 1.5 μm or less, and the microcrystalline silicon which is the i-type layer of the third pin junction has a film thickness of 1.5 μm or more and 3.5 μm or less. These films take a long time to be formed due to their large thicknesses, and therefore are not suitable for volume production.

Further, the stack-type photoelectric conversion device having the a-SiC/a-SiGe/a-SiGe structure also has the problem of the difficulty in forming, on a substrate of a large area, a film in which the ratio between the Si content and the Ge content is uniform, resulting in the difficulty in expanding the area of the substrate.

Regarding the above-described formation of semiconductor materials for the photoelectric conversion devices, change of the flow of the material gases involves change of the reaction pressure and therefore requires regulation of the pressure in the chamber. It is, however, difficult to precisely regulate the pressure in the chamber according to the reaction pressure, and accordingly the photoelectric conversion devices for which the produced semiconductor materials are used may lack reliability. The frequency can be changed to thereby improve the precision in controlling the bandgap in the thickness direction. In the case, however, where the photoelectric conversion device (or substrate) is increased in size, the modulation of the frequency of the applied electric power may cause nonuniform plasma discharge, resulting in the possibility of deteriorated control of the bandgap in the thickness direction.

The technology disclosed herein has been made in view of the above-described issues, and provides a method for manufacturing a semiconductor film suitable for a practical photoelectric conversion device having a favorable photoelectric conversion efficiency and adapted to volume production and a substrate of an increased area, as well as a method for manufacturing a photoelectric conversion device including this semiconductor film.

Solution to Problem

A method for forming a film of the technology disclosed herein is a method for forming a semiconductor film by which the semiconductor film including an amorphous structure is manufactured by a plasma CVD method. The semiconductor film is an amorphous film of an SiGe-based compound or a microcrystalline film of an SiGe-based compound. The plasma CVD method controls a bandgap in a thickness direction of the semiconductor film by varying an ON time or an OFF time of electric power which is applied to generate a plasma and intermittently supplying the electric power. The ON time and the OFF time of the electric power are in a range in which a duty ratio represented by ON time/(ON time+OFF time)×100(%) satisfies a duty ratio of 10% or more and 50% or less.

For the method for forming a film of the technology disclosed herein, preferably the OFF time of the intermittently supplied electric power is 100 μsec or more. Further, the semiconductor film is preferably formed of a substantially intrinsic semiconductor.

The technology disclosed herein is a method for manufacturing a photoelectric conversion device having a semiconductor film including an amorphous structure. The semiconductor film includes an amorphous film of an SiGe-based compound or a microcrystalline film of an SiGe-based compound manufactured by a plasma CVD method. The plasma CVD method varies an ON time or an OFF time of electric power which is applied to generate a plasma along a thickness direction of the semiconductor film and intermittently supplies the electric power. The ON time and the OFF time of the electric power are in a range in which a duty ratio represented by ON time/(ON time+OFF time)×100(%) satisfies a duty ratio of not less than 10% and not more than 50%.

Preferably, the photoelectric conversion device includes a photoelectric conversion layer in which a semiconductor film of a first conductivity type, a substantially intrinsic semiconductor film, and a semiconductor film of a second conductivity type opposite to the first conductivity type are stacked, and the substantially intrinsic semiconductor film is an amorphous film of an SiGe-based compound or a microcrystalline film of an SiGe-based compound manufactured by the plasma CVD method.

The technology disclosed herein is a method for manufacturing a photoelectric conversion device having a semiconductor film including an amorphous structure. The semiconductor film includes an amorphous film of an SiGe-based compound or a microcrystalline film of an SiGe-based compound manufactured by a plasma CVD method. The photoelectric conversion device includes a plurality of photoelectric conversion layers each having a semiconductor film of a first conductivity type, a substantially intrinsic semiconductor film, and a semiconductor film of a second conductivity type opposite to the first conductivity type that are stacked. Respective substantially intrinsic semiconductor films in two photoelectric conversion layers selected from the plurality of photoelectric conversion layers are each an amorphous film of an SiGe-based compound or a microcrystalline film of an SiGe-based compound manufactured by the plasma CVD method. The plasma CVD method varies an ON time or an OFF time of electric power which is applied to generate a plasma along a thickness direction of the semiconductor films and intermittently supplies the electric power. The ON time and the OFF time of the electric power are in a range in which a duty ratio represented by ON time/(ON time+OFF time)×100(%) satisfies a duty ratio of not less than 10% and not more than 50%.

Preferably, the substantially intrinsic semiconductor film in one of the two photoelectric conversion layers that is located on a light incident side is formed by intermittently supplying electric power with the duty ratio higher than that for the substantially intrinsic semiconductor film in the other photoelectric conversion layer.

For the method for manufacturing a photoelectric conversion device of the technology disclosed herein, preferably the OFF time of the intermittently supplied electric power is not less than 100 μsec.

In accordance with the technology disclosed herein, a semiconductor film of an SiGe-based compound is formed by a plasma CVD method with a duty ratio in a specific range, and therefore, the semiconductor film can uniformly be formed on a large-area substrate. Further, according to the method for forming a film and the method for manufacturing of the technology disclosed herein as described above, the bandgap of each semiconductor film can be controlled precisely, and therefore, the lifetime and the reliability of the obtained photoelectric conversion device can be improved as compared with those obtained by the conventional method.

Furthermore, the photoelectric conversion device including the semiconductor films of the technology disclosed herein can be implemented as a highly practical photoelectric conversion device that effectively uses incident light and has a high photoelectric conversion efficiency, can achieve a practical cycle time in volume production, and can also adapt to an increased substrate area.

BRIEF DESCRIPTION OF DRAWINGS

FIG. 2 (*a*) is a schematic diagram illustrating a film formation method based on a multi-chamber plasma CVD method, and FIG. 2 (*b*) is a schematic diagram showing a more detailed configuration of each film deposition chamber.

FIG. 3 (*a*) is a diagram showing an example of the ON time and the OFF time of electric power according to the technology disclosed herein, and FIG. 3 (*b*) is a diagram showing another example of the ON time and the OFF time of electric power according to the technology disclosed herein.

DESCRIPTION OF EMBODIMENTS

Figure 1:
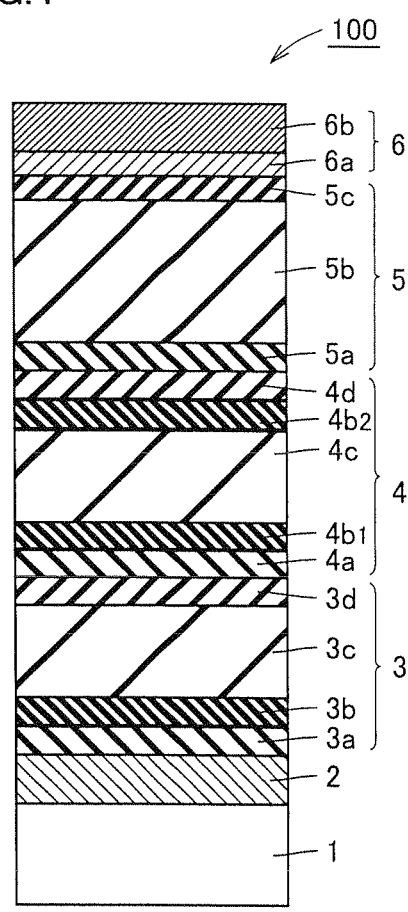
FIG. 1 is a schematic cross section of an example of the photoelectric conversion device according to a first embodiment.

The technology disclosed herein will hereinafter be described in more detail. The following description of embodiments is given with reference to the drawings. In the drawings of the present application, the same or corresponding components are denoted by the same reference characters. The following description of a photoelectric conversion device of a super-straight structure is also applicable to a sub-straight structure. Regarding the technology disclosed herein, a semiconductor film made of an amorphous semiconductor may also be referred to as "amorphous layer," a semiconductor film made of a microcrystalline semiconductor may also be referred to as "microcrystalline layer," and a film made of an amorphous or microcrystalline semiconductor may also be referred to as "semiconductor layer."

<Method for Forming Semiconductor Film>

The technology disclosed herein is a method for forming a semiconductor film that includes the step of manufacturing the semiconductor film by a plasma CVD method. The semiconductor film manufactured by the plasma CVD method includes an amorphous film of an SiGe-based compound or a microcrystalline film of an SiGe-based compound. The technology disclosed herein has been made based on the finding that such an amorphous film of an SiGe-based compound or a microcrystalline film of an SiGe-based compound can be formed by a plasma CVD method satisfying specific conditions described later herein to thereby improve precision in controlling the bandgap in the thickness direction of the whole film, and enable favorable bandgap controllability to be exhibited even for a photoelectric conversion device using a large-area substrate.

The above-described plasma CVD method changes the ON time or OFF time of electric power, which is applied for generating a plasma, and intermittently supplies the electric power, to thereby control the bandgap in the thickness direction of the semiconductor film.

The condition that the ON time or OFF time of electric power is changed and the electric power to be applied is intermittently supplied is comparable to the condition that AC power is applied in a pulse form. When a film is formed under this condition, radical species generated in the ON time can be extinguished in the OFF time except for a radical specie ($SiH_3$ for example) having a long lifetime which is necessary for forming a good-quality semiconductor film. Thus, a good-quality semiconductor film can be formed. In the case where the ON time or OFF time of electric power is varied and the electric power to be applied is intermittently supplied, an instantaneous applied voltage can be made large to generate a uniform plasma, and the electric power can be fed in a pulse form, to thereby reduce a time-average of the amount of electric power and lower the speed at which the film is formed. In this way, a high-quality amorphous semiconductor film can be uniformly formed in the direction parallel to the substrate surface, at a desired film formation speed.

The technology disclosed herein has a feature that the above-described ON time and OFF time of electric power satisfy a range in which the duty ratio, which is defined as ON time/(ON time+OFF time)×100(%), is not lower than 10% and not higher than 50%. It has been found that, when an amorphous film of an SiGe-based compound or a microcrystalline film of an SiGe-based compound is to be formed, the ON time or OFF time can be changed to vary the duty ratio in the above-described range, to thereby precisely control the bandgap in the thickness direction of the semiconductor film and improve the optical sensitivity for incident light. In particular, regarding the SiGe-based compound, it has been found that the above-described optical sensitivity is improved with decrease of the duty ratio. More preferably, the upper limit of the duty ratio is 50% or less. In the case of the amorphous layer, the duty ratio is more preferably not lower than 10% and not higher than 50%. In the case of the microcrystalline layer, the duty ratio is more preferably not lower than 10% and not higher than 50%. While the duty ratio of less than 10% still enables the effects of the technology disclosed herein to be achieved, a lower ON time ratio lengthens the time required for forming a film. Therefore, the duty ratio of not lower than 10% is preferred in terms of manufacturing efficiency.

The ON time and the OFF time of a plasma to be intermittently supplied will be described based on FIG. 3 (*a*) and FIG. 3 (*b*). FIG. 3 (*a*) and FIG. 3 (*b*) are each a diagram showing an example of the ON time and the OFF time of electric power. For the technology disclosed herein, the duty ratio is represented by ON time/(ON time+OFF time)×100(%). Namely, the duty ratio is for example $t_{ON}/T1 \times 100(\%)$ where T1 is the period of one cycle of a supplied plasma, $t_{ON}$ is the ON time, and t.sub.OFF is the OFF time. Likewise, the duty ratio in FIG. 3 (*b*) is $t_{ON}/T2 \times 100(\%)$.

According to the technology disclosed herein, the ON time or the OFF time of electric power which is applied for generating a plasma is changed and the electric power is intermittently supplied. Specifically, it is preferable as shown in FIG. 3 (*a*) and FIG. 3 (*b*) to keep ON time $t_{ON}$ unchanged and change OFF time $t_{OFF}$ to thereby change the period of one cycle from T1 to T2 (T1>T2) and accordingly change the duty ratio. Alternatively, OFF time $t_{OFF}$ may be kept unchanged and the ON time may be changed to vary the duty ratio, or the period of one cycle may be kept unchanged and ON time $t_{ON}$ and OFF time $t_{OFF}$ may be changed to vary the duty ratio. In the case where ON time $t_{ON}$ is kept constant while the OFF time is varied as described above to manufacture one semiconductor film, a plasma is generated stably and thus a resultant semiconductor film has favorable properties.

The period of one cycle of the applied electric power depends on the power density. In the case where the power density is for example from 0.01 $W/cm^2$ to 0.3 $W/cm^2$, the period of one cycle is preferably 25 μseconds or more and 5000 μseconds or less. ON time $t_{ON}$ is preferably 5 μseconds or more and 500 seconds or less, and more preferably 25 μseconds or more and 500 μseconds or less. OFF time $t_{OFF}$ is preferably 20 μseconds or more and 4500 seconds or less, and more preferably 100 μseconds or more and 4500 μseconds or less. ON time $t_{ON}$ which meets the above-defined range can provide a deposition rate that enables a good-quality semiconductor film to be formed. OFF time $t_{OFF}$ which meets the above-defined range can provide a pulse different from that under a continuous discharge condition so that a film can be formed with long-lifetime radicals only. Further, damage to the film while it is formed can be suppressed, and a high-quality semiconductor film in which the ratio of unstable $SiH_2$ coupling in the resultant semiconductor film is low can be formed.

The above-described electric power to be supplied is generally AC power with a frequency of 13.56 MHz. The electric power, however, is not limited to this. A frequency from several kHz to the VHF band, and further to the microwave band may also be used. Further, the power density may be adjusted as appropriate depending on the thickness of a semiconductor film. For example, the power density is preferably from 0.01 W/cm² to 0.3 W/cm², and more preferably from 0.02 W/cm² to 0.1 W/cm².

For manufacture of the above-described semiconductor film, the substrate temperature is preferably not more than 250° C., and more preferably in a range of 150° C. or more and 250° C. or less.

It is preferable that the film is thus formed in an atmosphere in which the pressure condition is 10 Pa or more and 3000 Pa or less, and more preferably 100 Pa or more and 2000 Pa or less. When the pressure condition meets the above-defined range, the semiconductor film is deposited in a favorable state and damages due to the plasma can be suppressed.

Regarding the gases from which the semiconductor film is to be formed, the flow ratio $GeH_4/(SiH_4+GeH_4)$ is preferably 0.5% or more and 10% or less, and more preferably 1% or more and 8% or less. The flow ratio of the gases in the above-defined range enables a semiconductor film having a favorable photosensitivity characteristic to be formed. Further, $H_2/SiH_4$ is desirably 1 or more, more desirably 3 or more, and preferably 10 or more. Furthermore, the upper limit of $H_2/SiH_4$ is desirably 80 or less, and more desirably 60 or less. Use of $H_2$ and $SiH_4$ at this ratio can provide a bandgap suitable for an SiGe-based compound. The bandgap suitable for an SiGe-based compound is for example 1.5 to 1.6 eV.

An amorphous film of an SiGe-based compound or a microcrystalline film of an SiGe-based compound formed in the above-described manner has a thickness of approximately 50 nm or more and 2000 nm or less. Even if the film has a large thickness of more than 100 nm, the bandgap can be controlled favorably by the method for forming a film of the technology disclosed herein.

In the following, regarding a method for manufacturing a photoelectric conversion device that includes the method for forming a semiconductor film of the technology disclosed herein, a detailed description will be given of a stack-type photoelectric conversion device in which three photoelectric conversion layers are stacked.

First Embodiment

In connection with a first embodiment, a description will be given of a method for manufacturing a photoelectric conversion device having the configuration shown in FIG. 1 and Table 1. This method includes the above-described method for forming a semiconductor film of the technology disclosed herein.

(1) Configuration of Photoelectric Conversion Device

FIG. 1 and Table 1 show a schematic diagram of a cross section of a photoelectric conversion device 100 in the first embodiment. As shown in FIG. 1, photoelectric conversion device 100 in the first embodiment includes, on a first electrode 2 disposed on a substrate 1, a photoelectric conversion layer having a pin junction in which a semiconductor film of a first conductivity type, a substantially intrinsic semiconductor film, and a semiconductor film of a second conductivity type which is opposite to the first conductivity type are stacked. On the uppermost part of the photoelectric conversion layer, a second electrode 6 made up of a transparent conductive film 6a and a metal film 6b is disposed. Light is incident from the substrate side of the above-described photoelectric conversion device 100. In the first embodiment, the first conductivity type is defined as p type and the second conductivity type is defined as n type.

TABLE 1

Configuration of Photoelectric Conversion Device of First Embodiment

| | structure | composition |
|---|---|---|
| substrate 1 | | glass |
| 1st electrode 2 | | $SnO_2$ |
| 1st photoelectric conversion layer 3 | p-type amorphous layer 3a | amorphous SiC |
| | buffer layer 3b | amorphous SiC |
| | i-type amorphous layer 3c | amorphous Si |
| | n-type semiconductor layer 3d | amorphous Si |
| 2nd photoelectric conversion layer 4 | p-type amorphous layer 4a | amorphous SiC |
| | buffer layer $4b_1$ | amorphous SiC |
| | i-type amorphous layer 4c | amorphous SiGe |
| | buffer layer $4b_2$ | amorphous SiC |
| | n-type semiconductor layer 4d | amorphous Si |
| 3rd photoelectric conversion layer 5 | p-type microcrystalline layer 5a | microcrystalline Si |
| | i-type microcrystalline layer 5b | microcrystalline Si |
| | n-type microcrystalline layer 5c | microcrystalline Si |
| 2nd electrode 6 | transparent conductive film 6a | ZnO |
| | metal film 6b | Ag |

The above-described substrate 1 and first electrode 2 are each made of a translucent material. Specifically, substrate 1 is made of glass, resin such as polyimide, or the like, and first electrode 2 may be made of $SnO_2$, tin-doped indium oxide (ITO), or the like. In the first embodiment, first electrode 2 is $SnO_2$. Respective thicknesses of substrate 1 and first electrode 2 are not particularly limited.

A first photoelectric conversion layer 3 is formed on the first electrode and has a structure in which a p-type amorphous layer 3a of amorphous SiC as the semiconductor film of the first conductivity type, a buffer layer 3b formed of an i-type amorphous layer of amorphous SiC, an i-type amorphous layer 3c of amorphous Si as the substantially intrinsic semiconductor film, and an n-type semiconductor layer 3d of amorphous Si as the semiconductor film of the second conductivity type opposite to the first conductivity type, are stacked. The buffer layer may not be provided.

A second photoelectric conversion layer 4 is formed on the above-described first photoelectric conversion layer 3, and has a structure in which: a p-type amorphous layer 4a of amorphous SiC as the semiconductor film of the first conductivity type; a buffer layer $4b_1$ which is an i-type amorphous layer formed of an i-type amorphous Si-based semiconductor film; an i-type amorphous layer 4c of amorphous SiGe as the substantially intrinsic semiconductor film; a buffer layer $4b_2$ which is an i-type amorphous layer formed of an i-type amorphous Si-based semiconductor film; and an n-type semiconductor layer 4d of amorphous Si as the semiconductor film of the second conductivity type opposite to the first conductivity type, are stacked. The buffer layers may not be provided.

A third photoelectric conversion layer 5 is formed on the above-described second photoelectric conversion layer 4 and has a structure in which a p-type microcrystalline layer 5a of microcrystalline Si as the semiconductor film of the first conductivity type, an i-type microcrystalline layer 5b of microcrystalline Si as the substantially intrinsic semiconductor film, and an n-type microcrystalline layer 5c of microcrystalline Si as the semiconductor film of the second conductivity type opposite to the first conductivity type, are stacked.

In the first photoelectric conversion layer, the second photoelectric conversion layer, and the third photoelectric conversion layer each, the semiconductor film of the first conductivity type (p-type amorphous layer) is a semiconductor film doped with p-type impurity atoms such as boron or aluminum. Further, each semiconductor film of the second conductivity type (n-type amorphous layer) is a semiconductor film doped with n-type impurity atoms such as phosphorus. The substantially intrinsic semiconductor film may be a completely-non-doped semiconductor film, or a semiconductor layer of a weak p-type or weak n-type containing a slight amount of impurities and having an adequate photoelectric conversion capability.

Here, in the photoelectric conversion device of the first embodiment, i-type amorphous layer $3c$ of first photoelectric conversion layer 3 has a larger forbidden band width than i-type amorphous layer $4c$ of second photoelectric conversion layer 4. Further, i-type amorphous layer $4c$ of second photoelectric conversion layer 4 has a larger forbidden band width than i-type microcrystalline layer $5b$ of third photoelectric conversion layer 5. Thus, in terms of the width of the forbidden band, the relation: i-type amorphous layer $3c$ of first photoelectric conversion layer 3>i-type amorphous layer $4c$ of second photoelectric conversion layer 4>i-type microcrystalline layer $5b$ of third photoelectric conversion layer 5, enables a wide wavelength range of the light entering from substrate 1 side to contribute to photoelectric conversion.

It is noted that the width of the forbidden band of i-type amorphous layer $3c$ of first photoelectric conversion layer 3 may be equal to or smaller than the width of the forbidden band of i-type amorphous layer $4c$ of second photoelectric conversion layer 4. In this case as well, i-type amorphous layer $4c$ of second photoelectric conversion layer 4 contributes to absorption of the light that is left un-absorbed by i-type amorphous layer $3c$ of first photoelectric conversion layer 3.

Second electrode 6 disposed on the uppermost part of the photoelectric conversion layers is constituted of transparent conductive film $6a$ and metal film $6b$. Transparent conductive film $6a$ made of ZnO for example, and metal film $6b$ made of Ag for example may be used.

In general, as the i-type amorphous layer has a larger thickness, a greater influence of optical degradation of the i-type amorphous layer is exerted on the photoelectric conversion efficiency. Even if respective optical degradation characteristics per unit thickness of i-type amorphous layers are identical to each other, an i-type amorphous layer of a larger thickness causes a greater decrease of the photoelectric conversion efficiency. The technology disclosed herein forms two photoelectric conversion layers having respective i-type amorphous layers so that the i-type amorphous layer included in the first photoelectric conversion layer can be made relatively thin. In this way, degradation of the i-type amorphous layer included in the first photoelectric conversion layer can be lessened.

(2) Constituent Materials of Photoelectric Conversion Device

According to the technology disclosed herein, the above-described semiconductor film includes an amorphous film of an SiGe-based compound or a microcrystalline film of an SiGe-based compound that is formed by the plasma CVD method. Regarding the SiGe-based compound, examples of the SiGe-based compound that forms the amorphous film include hydrogenated a-SiGe, fluorinated a-SiGe, hydrogenated and fluorinated a-SiGe, and the like. This is applied as well to the microcrystalline film. Microcrystal of the technology disclosed herein refers to a state in which a mixed phase of a crystalline component of a small grain size (several tens to thousands of Å) and an amorphous component is formed.

In the photoelectric conversion device of the triple-cell structure made up of three layers, namely the first photoelectric conversion layer, the second photoelectric conversion layer, and the third photoelectric conversion layer like the first embodiment, all layers may be made of the same silicon-based semiconductor or made of respective silicon-based semiconductors different from each other, as long as any of the first, second, and third photoelectric conversion layers includes the above-described amorphous film of an SiGe-based compound or a microcrystalline film of an SiGe-based compound.

For the first photoelectric conversion layer in the photoelectric conversion device of the first embodiment, amorphous films of an amorphous silicon (a-Si)-based compound, an amorphous silicon carbide (a-SiC)-based compound, and an amorphous silicon monoxide (a-SiO)-based compound, and the like may be used.

For the second photoelectric conversion layer, amorphous films of an amorphous silicon (a-Si)-based compound, an amorphous silicon germanium (a-SiGe)-based compound and the like, as well as microcrystalline films of a microcrystalline silicon (μc-Si)-based compound and the like, may be used. Further, for the third photoelectric conversion layer, amorphous films of an amorphous silicon germanium (a-SiGe)-based compound and the like, as well as microcrystalline films of a microcrystalline silicon (μc-Si)-based compound, a microcrystalline silicon germanium (μc-SiGe)-based compound and the like, may be used.

As long as any of the above-illustrated first photoelectric conversion layer, second photoelectric conversion layer, and third photoelectric conversion layer includes an amorphous film of an SiGe-based compound or a microcrystalline film of an SiGe-based compound, the composition of each layer may be any combination.

In a photoelectric conversion device of a tandem-cell structure made up of two layers, namely a first photoelectric conversion layer and a second photoelectric conversion layer, all layers may be made of the same silicon-based semiconductor or made of respective silicon-based semiconductors different from each other, as long as one of or both the first and second photoelectric conversion layers includes the above-described amorphous film of an SiGe-based compound or microcrystalline film of an SiGe-based compound.

For the first photoelectric conversion layer in the photoelectric conversion device of the tandem-cell structure, amorphous films of an amorphous silicon (a-Si)-based compound, an amorphous silicon carbide (a-SiC)-based compound, an amorphous silicon monoxide (a-SiO)-based compound, an amorphous silicon germanium (a-SiGe)-based compound and the like may be used.

For the second photoelectric conversion layer, amorphous films of an amorphous silicon germanium (a-SiGe)-based compound and the like, as well as microcrystalline films of a microcrystalline silicon (μc-Si)-based compound, a microcrystalline silicon germanium (μc-Site)-based compound and the like may be used.

While the following description will be given of a triple-cell-structure photoelectric conversion device, the photoelectric conversion device of the technology disclosed herein is not limited to the triple-cell structure and, as a matter of course, may be a photoelectric conversion device having four or more photoelectric conversion layers. In a photoelectric conversion device including four or more photoelectric conversion layers, an appropriate combination of the above-described components may be used.

Further, the p-type semiconductor layer, the i-type semiconductor layer, and the n-type semiconductor layer may each have a single-layer structure or multi-layer structure. In the case where the semiconductor layer is made up of multiple layers, the layers may be made of respective silicon-based semiconductors different from each other.

(3) Plasma CVD Apparatus

Referring next to FIG. 2 (a) and FIG. 2 (b), a plasma CVD apparatus for forming semiconductor layers included in the above-described photoelectric conversion device will be described. FIG. 2 (a) is a schematic cross section of a multi-chamber plasma CVD apparatus used for manufacturing the semiconductor layers included in the photoelectric conversion device of the first embodiment, and FIG. 2 (b) is a schematic diagram showing a more detailed configuration of each film deposition chamber in FIG. 2 (a).

A multi-chamber plasma CVD apparatus includes a plurality of film deposition chambers that are linearly arranged for example. FIG. 2 (a) shows the form in which three film deposition chambers, namely a first film deposition chamber 220, a second film deposition chamber 230, and a third film deposition chamber 240 are arranged. Between the film deposition chambers, a gate valve 8 for allowing or blocking communication between the film deposition chambers is provided, so that a substrate 1 can move across the film deposition chambers through gate valve 8. In each film deposition chamber, one pair of electrodes is provided. First film deposition chamber 220 is provided with a cathode electrode 222 and an anode electrode 223, second film deposition chamber 230 is provided with a cathode electrode 232 and an anode electrode 233, and a third film deposition chamber 240 is provided with a cathode electrode 242 and an anode electrode 243.

A more detailed configuration of each film deposition chamber will be described for first film deposition chamber 220 as an example. Second film deposition chamber 230 and third film deposition chamber 240 may have a similar configuration. As shown in FIG. 2 (b), each film deposition chamber includes hermetically-closable first film deposition chamber 220 for forming a semiconductor layer therein, a gas feed unit 211 for feeding a substitution gas 212 into first film deposition chamber 220, and a gas exhaust unit 206 for exhausting the substitution gas from first film deposition chamber 220. First film deposition chamber 220 of the plasma CVD apparatus used in the first embodiment may have a size of about 1 m³ for example.

The plasma CVD apparatus has, in film deposition chamber 220 which can be hermetically closed, a parallel-plate-type electrode structure in which cathode electrode 222 and anode electrode 223 are disposed. The distance between cathode electrode 222 and anode electrode 223 is determined in accordance with desired process conditions. Generally, the electrode-to-electrode distance is on the order of several mm to several tens of mm. On the outside of first film deposition chamber 220, a power supply unit 208 for supplying electric power to cathode electrode 222, and an impedance matching circuit 205 for providing an impedance match between power supply unit 208, cathode electrode 222, and anode electrode 223 are disposed.

Power supply unit 208 is connected to one end of an electric power feed line 208a. The other end of electric power feed line 208a is connected to impedance matching circuit 205. One end of an electric power feed line 208b is connected to impedance matching circuit 205, and the other end of electric power feed line 208b is connected to cathode electrode 222. Power supply unit 208 may be the one that can provide a CW (continuous wave) AC output by switching, as long as it can provide a pulse-modulated (on-off controlled) AC output.

Anode electrode 223 is electrically grounded, and substrate 1 is disposed on anode electrode 223. Substrate 1 is for example a substrate having the first electrode formed thereon.

While substrate 1 may be mounted on cathode electrode 222, substrate 1 is generally disposed on anode electrode 223 in order to reduce film-quality deterioration due to ion damage in the plasma.

First film deposition chamber 220 is provided with gas feed unit 211. From gas feed unit 211, a gas 212 such as diluent gas, raw-material gas, or doping gas is fed. The diluent gas may be a gas including hydrogen gas, and the raw-material gas may be silane-based gas, methane gas, geunane gas, or the like. The doping gas may be p-type-impurity doping gas such as diborane gas, n-type-impurity doping gas such as phosphine gas, or the like.

To first film deposition chamber 220, gas exhaust unit 206 and a pressure regulation valve 207 are connected in series, and the gas pressure in first film deposition chamber 220 is kept substantially constant. The gas pressure measured in first film deposition chamber 220 at a position near gas feed unit 211 and a position near a gas exhaust outlet 209 involves a slight error. It is therefore desirable to measure the gas pressure at a position away from gas feed unit 211 and gas exhaust outlet 209. In this state, electric power can be supplied to cathode electrode 222 to thereby generate a plasma between cathode electrode 222 and anode electrode 223, decompose the fed gas 212, and form a semiconductor layer on substrate 1.

Gas exhaust unit 206 may be capable of creating a high vacuum by evacuating first film deposition chamber 220 so that the gas pressure in the chamber is approximately $1.0 \times 10^{-4}$ Pa. In terms of simplification of the apparatus, reduction of the cost, and enhancement of the throughput, a gas exhaust unit that has an exhaust ability to set the pressure to approximately 0.1 Pa may also be used. First film deposition chamber 220 has a large capacity to adapt to an increased size of the substrate of the semiconductor device. In the case where such a first film deposition chamber 220 is evacuated so that a high vacuum is generated in the chamber, a high-performance gas exhaust unit 206 is required, which is not desirable in terms of simplification of the apparatus and reduction of the cost. It is thus more desirable to use a simple and low-vacuum-adapted gas exhaust unit 206.

The simple and low-vacuum-adapted gas exhaust unit 206 may for example be a rotary pump, a mechanical booster pump, a sorption pump, or the like. One of or a combination of two or more of them is preferably used. As a typical gas exhaust unit 206, a combination of a mechanical booster pump and a rotary pump connected in series may be used.

The configuration shown in FIG. 2 (a) and FIG. 2 (b) is given by way of example, and an apparatus having another configuration may also be used to form semiconductor layers. Regarding semiconductor layers other than semiconductor layers of an SiGe-based compound, the process step of forming the semiconductor layers by a method other than the plasma CVD may be included. In the following, a multi-chamber plasma CVD apparatus forming p-type, i-type, and n-type semiconductor films in respective film deposition chambers different from each other will be described by way of example. The semiconductor films, however, can be formed as well by a similar method even if a single-chamber plasma CVD apparatus having only one film deposition chamber is used. In the case where a single-chamber plasma CVD apparatus is used, preferably a known gas substitution step is included.

(4) Method for Manufacturing Photoelectric Conversion Device 100

Next, a method for manufacturing photoelectric conversion device 100 configured as shown in Table 1 and FIG. 1 will be described. Photoelectric conversion device 100 can be manufactured by forming, on substrate 1, first electrode 2, first photoelectric conversion layer 3, second photoelectric conversion layer 4, third photoelectric conversion layer 5, and second electrode 6 in this order from the light incident side.

In the case where a multi-chamber plasma CVD apparatus is used, generally p-type amorphous layer 3a and buffer layer 3b are formed in first film deposition chamber 220, i-type amorphous layer 3c is formed in second film deposition chamber 230, and n-type semiconductor layer 3d is formed in third film deposition chamber 240, for example. Further, p-type amorphous layer 4a, buffer layer 4b, and p-type microcrystalline layer 5a are each formed in first film deposition chamber 220, i-type amorphous layer 4c and i-type microcrystalline layer 5b are each formed in second film deposition chamber 230, and n-type semiconductor layer 4d and n-type microcrystalline layer 5c are each formed in third film deposition chamber 240. The apparatus, however, is not limited to such a form. For example, the apparatus provided with a greater number of multiple film deposition chambers may be used to form the p-type amorphous layer and the buffer layer in different film deposition chambers, respectively.

In the first embodiment, the three photoelectric conversion layers are formed in the order of first photoelectric conversion layer 3, second photoelectric conversion layer 4, and third photoelectric conversion layer 5, from the first electrode 2 side on substrate 1. The three photoelectric conversion layers may also be formed for example on second electrode 6 in the order of third photoelectric conversion layer 5, second photoelectric conversion layer 4, and first photoelectric conversion layer 3. Further, in the case where a photoelectric conversion device of the sub-straight structure is to be formed, the three photoelectric conversion layers are preferably formed on the substrate in the order of third photoelectric conversion layer 5, second photoelectric conversion layer 4, and first photoelectric conversion layer 3. These structures are identical in that the layers are arranged, from the light incident side, in the order of first photoelectric conversion layer 3, second photoelectric conversion layer 4, and third photoelectric conversion layer 5.

(4-1) Step of Forming First Electrode 2

Firstly, first electrode 2 is formed on substrate 1. As substrate 1, a glass substrate having heat resistance in a plasma CVD formation process and having translucence, a resin substrate such as polyimide or the like can be used. As first electrode 2, a transparent conductive film of $SnO_2$, ITO, ZnO or the like can be used. They can be formed by a known method such as CVD, sputtering, or vapor deposition.

(4-2) Step of Forming First Photoelectric Conversion Layer 3

Secondly, first photoelectric conversion layer 3 is formed on first electrode 2 which has been formed on substrate 1. As described above, first photoelectric conversion layer 3 has p-type amorphous layer 3a, buffer layer 3b, i-type amorphous layer 3c, and n-type semiconductor layer 3d, and the semiconductor layers are formed one after another.

<Step of Forming P-type Amorphous Layer 3a>

P-type amorphous layer 3a is then formed. Initially, first film deposition chamber 220 is evacuated to 0.001 Pa, and the temperature of substrate 1 can be set to 200° C. or less. After this, p-type amorphous layer 3a is formed. A gas mixture is fed into first film deposition chamber 220, and pressure regulation valve 207 provided in the gas exhaust system is used to keep the pressure in first film deposition chamber 220 substantially constant. The pressure in first film deposition chamber 220 is for example 200 Pa or more and 3000 Pa or less. As the gas mixture fed into first film deposition chamber 220, a gas including silane gas, hydrogen gas, and diborane gas for example may be used, and further a gas containing carbon atoms (methane gas for example) may further be included for the purpose of reducing the amount of absorbed light. The flow of the hydrogen gas is desirably on the order of several times to several tens of times as high as that of the silane gas.

After the pressure in first film deposition chamber 220 becomes stable, AC power of several kHz to 80 MHz is applied to cathode electrode 222 to generate a plasma between cathode electrode 222 and anode electrode 223 and form p-type amorphous layer 3a. The power density per unit area of cathode electrode 222 may be 0.01 $W/cm^2$ or more and 0.3 $W/cm^2$ or less.

After p-type amorphous layer 3a of a desired thickness is formed in the above-described manner, the AC power is stopped from being applied, and first film deposition chamber 220 is evacuated to a vacuum. The thickness of p-type amorphous layer 3a can be increased in proportion to the total amount of electric power having been fed (power density× time). The thickness of p-type amorphous layer 3a is preferably 2 nm or more, and more preferably 5 nm or more, in order to provide a sufficient internal electric field to i-type amorphous layer 3c. Further, the thickness of p-type amorphous layer 3a is preferably 50 nm or less, and more preferably 30 nm or less, since it is necessary to lessen the amount of light absorbed by the inactive layer on the light incident side.

<Step of Forming Buffer Layer 3b>

Next, an i-type amorphous layer is formed as buffer layer 3b. Initially, first film deposition chamber 220 is evacuated to a vacuum so that the background pressure in the chamber is approximately 0.001 Pa. The temperature of substrate 1 can be set to 200° C. or less. Subsequently, a gas mixture is fed into first film deposition chamber 220, and pressure regulation valve 207 is used to keep the pressure in first film deposition chamber 220 substantially constant. The pressure in first film deposition chamber 220 is for example 200 Pa or more and 3000 Pa or less. As the gas mixture fed into first film deposition chamber 220, a gas including silane gas and hydrogen gas for example may be used, and further a gas containing carbon atoms (methane gas for example) may further be included for the purpose of reducing the amount of absorbed light. The flow of the hydrogen gas is desirably on the order of several times to several tens of times as high as that of the silane gas.

After the pressure in first film deposition chamber 220 becomes stable, AC power of several kHz to 80 MHz is applied to cathode electrode 222 to generate a plasma between cathode electrode 222 and anode electrode 223 and form the i-type amorphous layer which is buffer layer 3b. The power density per unit area of cathode electrode 222 may be 0.01 $W/cm^2$ or more and 0.3 $W/cm^2$ or less.

After the i-type amorphous layer of a desired thickness is formed as buffer layer 3b in the above-described manner, the AC power is stopped from being applied, and first film deposition chamber 220 is evacuated to a vacuum.

As the i-type amorphous layer which is buffer layer 3b is formed, the density of boron atoms in the atmosphere in first film deposition chamber 220 is reduced, and thus boron atoms mixed into subsequently formed i-type amorphous layer 3c can be reduced.

The thickness of the i-type amorphous layer which is buffer layer 3b is desirably 2 nm or more, in order to lessen diffusion of boron atoms from p-type amorphous layer 3a into i-type microcrystalline layer 5c. At the same time, in order to lessen the amount of absorbed light and increase the light which reaches i-type amorphous layer 3c, the thickness is desirably as small as possible. The thickness of buffer layer 3b is usually 50 nm or less.

<Step of Forming I-type Amorphous Layer 3c>

Next, i-type amorphous layer 3c is formed. The i-type layer is formed for example in second film deposition chamber 230. Initially, second film deposition chamber 230 is evacuated to a vacuum so that the background pressure in the chamber is approximately 0.001 Pa. The substrate temperature can be set to 200° C. or less. Subsequently, a gas mixture is fed into film deposition chamber 230, and the pressure regulation valve is used to keep the pressure in film deposition chamber 230 substantially constant. The pressure in film deposition chamber 230 is for example 200 Pa or more and 3000 Pa or less. As the gas mixture fed into first film deposition chamber 230, a gas including silane gas and hydrogen gas for example may be used. The flow of the hydrogen gas is preferably on the order of several times to several tens of times as high as that of the silane gas, and more preferably five times or more and 30 times or less as high as that of the silane gas. Thus i-type amorphous layer 3c of good quality can be formed.

After the pressure in film deposition chamber 230 becomes stable, AC power of several kHz to 80 MHz is applied to cathode electrode 232 to generate a plasma between cathode electrode 232 and anode electrode 233 and form i-type amorphous layer 3c. The power density per unit area of cathode electrode 232 may be 0.01 W/cm$^2$ or more and 0.3 W/cm$^2$ or less.

After i-type microcrystalline layer 5c of a desired thickness is formed in the above-described manner, the AC power is stopped from being applied, and film deposition chamber 230 is evacuated to a vacuum. The thickness of i-type microcrystalline layer 5c is preferably set to a value from 0.05 μm to 0.25 μm, in consideration of the amount of absorbed light, and degradation in photoelectric conversion characteristics due to optical degradation.

<Step of Forming N-Type Semiconductor Layer 3d>

Next, n-type semiconductor layer 3d is formed. The n-type semiconductor layer is formed for example in third film deposition chamber 240. Initially, third film deposition chamber 240 is evacuated to a vacuum so that the background pressure in the chamber is approximately 0.001 Pa. The substrate temperature can be set to 200° C. or less, for example, 150° C. Subsequently, a gas mixture is fed into third film deposition chamber 240, and the pressure regulation valve is used to keep the pressure in third film deposition chamber 240 substantially constant. The pressure in third film deposition chamber 240 is for example 200 Pa or more and 3000 Pa or less. As the gas mixture fed into film deposition chamber 240, a gas including silane gas, hydrogen gas, and phosphine gas may be used. The flow of the hydrogen gas may be five times or more and 300 times or less as high as that of the silane gas. In the case where an n-type microcrystalline layer is to be formed, the flow of the hydrogen gas is preferably on the order from 30 times to 300 times as high as that of the silane gas.

After the pressure in third film deposition chamber 240 becomes stable, AC power of several kHz to 80 MHz is applied to cathode electrode 242 to generate a plasma between cathode electrode 242 and anode electrode 243 and form amorphous or microcrystalline n-type semiconductor layer 3d. The power density per unit area of cathode electrode 242 may be 0.01 W/cm$^2$ or more and 0.3 W/cm$^2$ or less.

The thickness of n-type semiconductor layer 3d is preferably 2 nm or more, in order to provide a sufficient internal electric field to i-type amorphous layer 3c. At the same time, the thickness is preferably as small as possible, in order to lessen the amount of light absorbed by n-type semiconductor layer 3d which is an inactive layer, and is usually 50 nm or less.

Through the foregoing steps, first photoelectric conversion layer 3 including i-type amorphous layer 3c can be formed.

(4-3) Step of Forming Second Photoelectric Conversion Layer 4

Subsequently, second photoelectric conversion layer 4 is formed. Second photoelectric conversion layer 4 has p-type amorphous layer 4a, buffer layer 4$b_1$, i-type amorphous layer 4c, buffer layer 4$b_2$, and n-type semiconductor layer 4d, and the semiconductor layers are formed one after another. A feature of the first embodiment is that i-type amorphous layer 4c in this second photoelectric conversion layer 4 is made of amorphous SiGe, and the ON time and the OFF time of the plasma CVD method for i-type amorphous layer 4c are changed to meet the above-described method for forming a film of the technology disclosed herein. Other layers may each be formed by a method similar to the method for forming the corresponding layer of first photoelectric conversion layer 3. Respective thicknesses of the semiconductor layers other than i-type amorphous layer 4c and respective conditions under which they are formed may be identical to or different from those of the above-described first photoelectric conversion layer 3.

In the following, the step of forming second photoelectric conversion layer 4 will be described in detail.

<Step of Forming P-Type Amorphous Layer 4a>

Next, a similar method to that for p-type amorphous layer 3a of first photoelectric conversion layer 3 is used to form p-type amorphous layer 4a of amorphous SiC.

<Step of Forming Buffer Layer 4$b_1$>

Next, a similar method to that for buffer layer 3b of first photoelectric conversion layer 3 is used to form buffer layer 4$b_1$.

<Step of Forming I-type Amorphous Layer 4c>

Next, i-type amorphous layer 4c of amorphous SiGe is formed. In consideration of the amount of absorbed light and degradation in photoelectric conversion characteristics due to optical degradation, the thickness of i-type amorphous layer 4c is preferably set to a value from 50 nm to 500 nm. Further, the width of the forbidden band of i-type amorphous layer 4c in second photoelectric conversion layer 4 is desirably narrower than the width of the forbidden band of i-type amorphous layer 3c in first photoelectric conversion layer 3. With such a width of the forbidden band, the light of a wavelength band that could not be absorbed by first photoelectric conversion layer 3 can be absorbed by second photoelectric conversion layer 4, and the incident light can effectively be utilized.

The technology disclosed herein applies the above-described method for forming a film of the technology disclosed herein, in order to make narrower the width of the forbidden band of i-type amorphous layer 4c than the width of the forbidden band of i-type amorphous layer 3c in the above-described first photoelectric conversion layer 3.

Namely, initially the film deposition chamber is evacuated to a vacuum so that the background pressure in the film deposition chamber is approximately 0.001 Pa, and the temperature of substrate 1 is set to 150° C. or more and 250° C. or less. Next, a gas mixture is fed into the film deposition chamber, and the pressure regulation valve is used to make the pressure in the film deposition chamber substantially constant. The pressure in the film deposition chamber is for example 10 Pa or more and 3000 Pa or less. As the above-described gas mixture fed into the film deposition chamber, a gas including germane gas, silane gas, and hydrogen gas for example may be used. As for the flow ratio between them, the flow ratio between germane gas and silane gas is set so that $GeH_4/(SiH_4+GeH_4)$ is 0.5% or more and 10% or less. The flow of the hydrogen gas relative to the silane gas ($H_2/SiH_4$)

is desirably once or more as high as that of the silane gas and more preferably 5 times or more and 30 times or less as high as that of the silane gas.

After the pressure in the film deposition chamber becomes stable, AC power of a frequency for example of 13.56 MHz is applied to the cathode electrode to generate a plasma between the cathode electrode and the anode electrode and form i-type amorphous layer 3c. The power density per unit area of the cathode electrode may be 0.01 W/cm² or more and 0.3 W/cm² or less. As the above-described frequency, a frequency from several kHz to the VHF band and further to the microwave band may be used.

According to the technology disclosed herein, it is preferable that the ON time of electric power applied for generating the above-described plasma is 5 μseconds or more and 500 μseconds or less, the OFF time thereof is 20 μseconds or more and 4500 μseconds or less, and the duty ratio is set in a range of 10% or more and 50% or less. For example, the ON time is 500 μseconds and the OFF time is changed so that it gradually becomes longer in a range from 500 μseconds to 4500 μseconds. Alternatively, the OFF time may be constant in a certain period of time, and the OFF time in a period out of the certain period of time is changed to be longer or shorter.

In this way, i-type amorphous layer 4c of a desired thickness is formed, and thereafter the AC power is stopped from being applied and the film deposition chamber is evacuated to a vacuum.

<Step of Forming Buffer Layer $4b_2$>

Next, a similar method to that for buffer layer 3b of first photoelectric conversion layer 3 is used to form buffer layer $4b_2$.

<Step of Forming N-Type Semiconductor Layer 4d>

Next, a similar method to that for n-type semiconductor layer 3d of first photoelectric conversion layer 3 is used to form n-type semiconductor layer 4d.

(4-4) Step of Forming Third Photoelectric Conversion Layer 5

Subsequently, third photoelectric conversion layer 5 is formed. Third photoelectric conversion layer 5 has p-type microcrystalline layer 5a, i-type microcrystalline layer 5b, and n-type microcrystalline layer 5c, and the semiconductor layers are formed one after another. In the following, the step of forming third photoelectric conversion layer 5 will be described in detail.

<Step of Forming P-Type Microcrystalline Layer 5a>

Next, p-type microcrystalline layer 5a is formed on second photoelectric conversion layer 4. P-type microcrystalline layer 5a may be formed for example under the following conditions. The temperature of substrate 1 is desirably 200° C. or less. The pressure in the film deposition chamber when the film is formed is desirably 240 Pa or more and 3600 Pa or less. Further, the power density per unit area of the cathode electrode is desirably 0.01 W/cm² or more and 0.5 W/cm² or less.

As the gas mixture fed into the film deposition chamber, a gas including silane gas, hydrogen gas, and diborane gas for example may be used. The flow of the hydrogen gas is desirably on the order from several tens of times to several hundreds of times, and more desirably on the order from 30 times to 300 times as high as that of the silane gas.

The thickness of p-type microcrystalline layer 5a is preferably 2 nm or more, in order to provide a sufficient internal electric field to i-type microcrystalline layer 5b. At the same time, in order to lessen the amount of light absorbed by p-type microcrystalline layer 5a which is an inactive layer and to increase the light reaching i-type microcrystalline layer 5b, the thickness of p-type microcrystalline layer 5a is desirably as small as possible, and is usually 50 nm or less.

<Step of Forming I-Type Microcrystalline Layer 5b>

Next, i-type microcrystalline layer 5b is formed. I-type microcrystalline layer 5b may be formed for example under the following conditions. The substrate temperature is desirably 200° C. or less. The pressure in the film deposition chamber when the layer is formed is desirably 240 Pa or more and 3600 Pa or less. Further, the power density per unit area of the cathode electrode is desirably 0.02 W/cm² or more and 0.5 W/cm² or less.

As the gas mixture fed into the film deposition chamber, a gas including silane gas and hydrogen gas for example may be used. The flow of the hydrogen gas is desirably on the order from 30 times to several hundreds of times, and more desirably on the order from 30 times to 300 times as high as that of the silane gas.

In order to ensure sufficient amount of light absorption, the thickness of i-type microcrystalline layer 5b is preferably 0.5 μm or more, and more preferably 1 μm or more. At the same time, the thickness of i-type microcrystalline layer 5b is preferably 20 μm or less and more preferably 15 μm or less, for ensuring favorable productivity.

In this way, i-type microcrystalline layer 5b can be formed that has a favorable degree of crystallinity with the peak intensity ratio of the peak at 520 cm$^{-1}$ to the peak at 480 cm$^{-1}$, $I_{520}/I_{480}$, of 3 or more and 10 or less, which is measured by Raman spectroscopy.

<Step of Forming N-Type Microcrystalline Layer 5c>

Next, n-type microcrystalline layer 5c is formed. N-type microcrystalline layer 5c may be formed for example under the following conditions. The substrate temperature is desirably 200° C. or less. The pressure in the film deposition chamber when the layer is formed is desirably 240 Pa or more and 3600 Pa or less. Further, the power density per unit area of the cathode electrode is desirably 0.02 W/cm² or more and 0.5 W/cm² or less.

As the gas mixture fed into the film deposition chamber, a gas including silane gas, hydrogen gas, and phosphine gas for example may be used. The flow of the hydrogen gas is desirably on the order from several tens of times to several hundreds of times, and more desirably on the order from 30 times to 300 times as high as that of the silane gas.

The thickness of n-type microcrystalline layer 5c is preferably 2 nm or more, in order to provide a sufficient internal electric field to i-type microcrystalline layer 5b. At the same time, in order to lessen the amount of light absorbed by n-type microcrystalline layer 5c which is an inactive layer, the thickness of n-type microcrystalline layer 5c is desirably as small as possible, and is usually 50 nm or less.

(4-5) Step of Forming Second Electrode 6

Subsequently, second electrode 6 is formed on third photoelectric conversion layer 5. Second electrode 6 is made up of transparent conductive film 6a and metal film 6b, and they are formed one after another. Transparent conductive film 6a is made of $SnO_2$, ITO, ZnO, or the like. Metal film 6b is made of a metal such as silver or aluminum. Transparent conductive film 6a and metal film 6h are formed by a method such as CVD, sputtering, or vapor deposition. Transparent conductive film 6a may not be provided.

In this way, the process for manufacturing a photoelectric conversion device in the present embodiment is completed. In the above-described photoelectric conversion device, an intermediate layer may be provided for example between second photoelectric conversion layer 4 and third photoelectric conversion layer 5. Examples of such an intermediate layer may include transparent conductive films of ZnO, SnO$_2$, ITO, and the like, and layers made of SiN, SiO, and the like.

The photoelectric conversion device manufactured in the above-described manner is formed through the process including the method for forming a film of the technology disclosed herein. Therefore, even if a substrate having a large area on the order of 2 m$^2$ is used, the bandgap in the thickness direction of the semiconductor films is controlled with high precision.

According to the description above, the semiconductor layers are formed, by way of example, by the multi-chamber plasma CVD apparatus in which a plurality of film deposition chambers are provided as shown in FIG. 2. Instead, the semiconductor layers can also be formed similarly by a single-chamber plasma CVD apparatus. In this case, the p-type, i-type, and n-type semiconductor layers are formed in a single film deposition chamber, and therefore, it is preferable to provide a known gas substitution step between the process steps.

Second Embodiment

Figure 4:
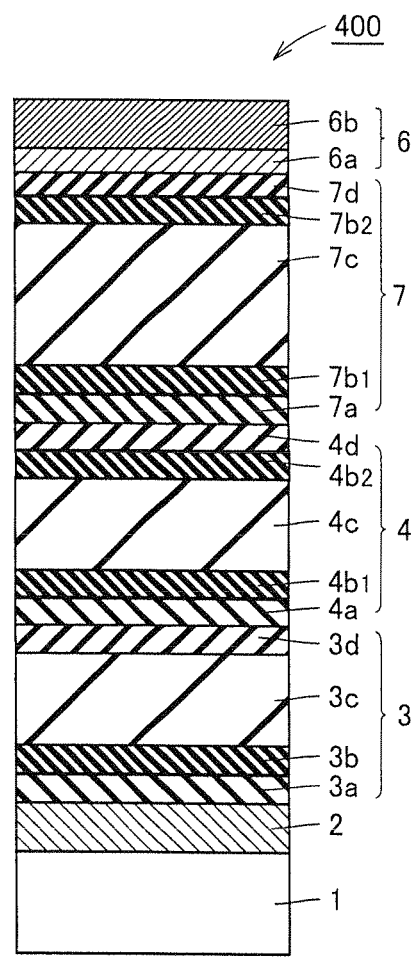
FIG. 4 is a schematic cross section of an example of the photoelectric conversion device according to a second embodiment.

A second embodiment relates to a method for manufacturing a photoelectric conversion device having the configuration shown in FIG. 4 and Table 2 that includes the above-described method for forming a semiconductor film of the technology disclosed herein. The second embodiment is similar to the above-described first embodiment except that a third photoelectric conversion layer has a configuration similar to that of the second photoelectric conversion layer in the first embodiment. Therefore, the description thereof will not be repeated.

FIG. 4 and Table 2 show a schematic diagram of a cross section of a photoelectric conversion device 400 in the second embodiment. As shown in FIG. 4, photoelectric conversion device 400 in the second embodiment includes, on a first electrode 2 disposed on a substrate 1, a photoelectric conversion layer having a pin junction in which a semiconductor film of a first conductivity type, a substantially intrinsic semiconductor film, and a semiconductor film of a second conductivity type which is opposite to the first conductivity type are stacked. On the uppermost part of the photoelectric conversion layer, a second electrode 6 made up of a transparent conductive film 6a and a metal film 6b is disposed. Light is incident from the substrate side of the above-described photoelectric conversion device 400. In the second embodiment, the first conductivity type is defined as p type and the second conductivity type is defined as n type.

TABLE 2

Configuration of Photoelectric Conversion Device of Second Embodiment

| structure | | composition |
|---|---|---|
| substrate 1 | | glass |
| 1st electrode 2 | | SnO$_2$ |
| 1st photoelectric conversion layer 3 | p-type amorphous layer 3a | amorphous SiC |
| | buffer layer 3b | amorphous SiC |
| | i-type amorphous layer 3c | amorphous Si |
| | n-type semiconductor layer 3d | amorphous Si |
| 2nd photoelectric conversion layer 4 | p-type amorphous layer 4a | amorphous SiC |
| | buffer layer 4b$_1$ | amorphous SiC |
| | i-type amorphous layer 4c | amorphous SiGe |
| | buffer layer 4b$_2$ | amorphous SiC |
| | n-type semiconductor layer 4d | amorphous Si |

TABLE 2-continued

Configuration of Photoelectric Conversion Device of Second Embodiment

| structure | | composition |
|---|---|---|
| 3rd photoelectric conversion layer 7 | p-type amorphous layer 7a | amorphous SiC |
| | buffer layer 7b$_1$ | amorphous SiC |
| | i-type amorphous layer 7c | amorphous SiGe |
| | buffer layer 7b$_2$ | amorphous SiC |
| | n-type semiconductor layer 7d | amorphous Si |
| 2nd electrode 6 | transparent conductive film 6a | ZnO |
| | metal film 6b | Ag |

In the second embodiment, the component corresponding to third photoelectric conversion layer 5 of the first embodiment has the same configuration as second photoelectric conversion layer 4 of the first embodiment. Namely, a third photoelectric conversion layer 7 of the second embodiment is formed on the above-described second photoelectric conversion layer 4, and has a structure in which: a p-type amorphous layer 7a of amorphous SiC as the semiconductor film of the first conductivity type; a buffer layer 7b$_1$ which is an i-type amorphous layer formed of an amorphous Si-based semiconductor film; an i-type amorphous layer 7c of amorphous SiGe as the substantially intrinsic semiconductor film; a buffer layer 7b$_2$ which is an i-type amorphous formed of an amorphous Si-based semiconductor film; and an n-type semiconductor layer 7d of amorphous Si as the semiconductor film of the second conductivity type opposite to the first conductivity type, are stacked. The buffer layers may not be provided.

In this photoelectric conversion device, an intermediate layer may be provided for example between second photoelectric conversion layer 4 and third photoelectric conversion layer 5, similarly to the first embodiment. Examples of such an intermediate layer may include transparent conductive films of ZnO, SnO$_2$, ITO, and the like, and layers made of SiN, SiO, and the like.

Here, the width of the forbidden band of i-type amorphous layer 4c of amorphous SiGe that is provided as the substantially intrinsic semiconductor film in second photoelectric conversion layer 4, and the width of the forbidden band of i-type amorphous layer 7c of amorphous SiGe that is provided as the substantially intrinsic semiconductor film in third photoelectric conversion layer 7 can be made comparable to each other, or the width of the forbidden band of i-type amorphous layer 7c in third photoelectric conversion layer 7 can be made smaller to perform effective photoelectric conversion of a wide wavelength range of the incident light.

In order to satisfy the above-described relation of the forbidden band width in the second embodiment, the duty ratio, which is one of semiconductor film forming conditions for i-type amorphous layer 4c of amorphous SiGe provided as the substantially intrinsic semiconductor film in second photoelectric conversion layer 4, may be set higher than the duty ratio, which is one of semiconductor film forming conditions for i-type amorphous layer 7c of amorphous SiGe provided as the substantially intrinsic semiconductor film in third photoelectric conversion layer 7. By way of example, the duty ratio, which is one of the semiconductor film forming conditions for i-type amorphous layer 4c may be 40%, and the duty ratio, which is one of the semiconductor film forming conditions for i-type amorphous layer 7c may be 10%.

Alternatively, the width of the forbidden band can be adjusted by varying the gas flow as has been done conventionally. In the case where a photoelectric conversion device of a large area is to be manufactured, control of the gas flow is inadequate. In contrast, in the case where films are formed by the plasma CVD method of the technology disclosed herein that changes the ON time and the OFF time in a range that satisfies a specific duty ratio, a desired bandgap can be implemented precisely.

Example 1

In the following, the method for forming a film and the method for manufacturing a photoelectric conversion device of the technology disclosed herein will be described in more detail with reference to Examples. The technology disclosed herein, however, is not limited to them.

In this Example, a stack-type photoelectric conversion device 1 having the structure shown in FIG. 1 was manufactured using a multi-chamber plasma CVD apparatus as shown in FIG. 2 (a), in accordance with the above-described first embodiment. In the plasma CVD apparatus used in the present Example, each film deposition chamber has a size of 1 m×1 m×50 cm. The components were each made of the material shown in Table 1 and with a thickness.

In the following, each process step will be described in detail. In the present Example, the semiconductor layers except for the substantially intrinsic semiconductor layer (i-type amorphous layer 4c) in the second photoelectric conversion layer were formed by continuous plasma discharge.

1. Step of Forming First Photoelectric Conversion Layer 3
<Step of Forming P-Type Amorphous Layer 3a>

Initially, on substrate 1 having a thickness of 4 mm on which first electrode 2 having a thickness of 1 μm and made of $SnO_2$ was formed, p-type amorphous silicon carbide was formed as p-type amorphous layer 3a. P-type amorphous layer 3a was formed under the conditions: the temperature of substrate 1 was 200° C.; the pressure in first film deposition chamber 220 of the plasma CVD apparatus was 500 Pa; the power density per unit area of the cathode electrode was 0.05 W/cm$^2$; the gas mixture fed into first film deposition chamber 220 was 150 sccm of $SiH_4$ gas, 80 sccm of $B_2H_6$ gas (diluted with hydrogen to 0.1%), and 150 sccm of $CH_4$ gas; and the flow ratio, $H_2$ gas/$SiH_4$ gas, was set so that the flow of $H_2$ gas was 20 times as high as the flow of $SiH_4$ gas. This layer was formed to a thickness of 15 nm.

<Step of Forming Buffer Layer 3b>

Next, on p-type amorphous layer 3a, i-type amorphous silicon carbide was formed as buffer layer 3b. Buffer layer 3b starts being formed under the conditions: the temperature of substrate 1 was 200° C.; the pressure in first film deposition chamber 220 of the plasma CVD apparatus was 500 Pa; the power density per unit area of the cathode electrode was 0.05 W/cm$^2$; the gas mixture fed into first film deposition chamber 220 was 150 sccm of $SiH_4$ gas and 150 seem of $CH_4$ gas; and the flow ratio, $H_2$ gas/$SiH_4$ gas, was set so that the flow of $H_2$ gas was 10 times as high as the flow of $SiH_4$ gas. The gas flow was controlled so that the flow of $CH_4$ gas gradually decreased from 150 sccm to zero sccm. This layer was formed to a thickness of 10 nm. Here, the flow of $CH_4$ gas may be controlled so that it gradually decreases or may be controlled so that it decreases in a stepwise manner. It is desirable to control the flow of $CH_4$ gas so that it decreases gradually or in a stepwise manner, since discontinuity of the band profile at the interface between p-type amorphous layer 3a and i-type amorphous layer 3c can be alleviated.

<Step of Forming I-Type Amorphous Layer 3c>

Next, on buffer layer 3b, an i-type amorphous silicon layer was formed as i-type amorphous layer 3c. I-type amorphous layer 3c was formed under the conditions: the temperature of substrate 1 was 180° C.; the pressure in second film deposition chamber 230 of the plasma CVD apparatus was 500 Pa; the power density per unit area of the cathode electrode was 0.07 W/cm$^2$; the gas mixture fed into second film deposition chamber 230 was 300 sccm of $SiH_4$ gas; and the flow ratio, $H_2$ gas/$SiH_4$ gas, was set so that the flow of $H_2$ gas was 20 times as high as the flow of $SiH_4$ gas. This layer was formed to a thickness of 100 nm.

<Step of Forming N-Type Semiconductor Layer 3d>

Next, on i-type amorphous layer 3c, an amorphous silicon layer was formed as n-type semiconductor layer 3d. N-type semiconductor layer 3d was formed under the conditions: the temperature of substrate 1 was 200° C.; the pressure in third film deposition chamber 240 of the plasma CVD apparatus was 500 Pa; the power density per unit area of the cathode electrode was 0.05 W/cm$^2$; the gas mixture fed into third film deposition chamber 240 was 150 sccm of $SiH_4$ gas and 30 sccm of $PH_3$ gas (diluted with hydrogen to 1%); and the flow ratio, $H_2$ gas/$SiH_4$ gas, was set so that the flow of $H_2$ gas was 5 times as high as the flow of $SiH_4$ gas. This layer was formed to a thickness of 25 nm.

2. Step of Forming Second Photoelectric Conversion Layer 4

<Step of Forming P-Type Amorphous Layer 4a>

Next, on n-type semiconductor layer 3d of first photoelectric conversion layer 3, p-type amorphous silicon carbide was formed as p-type amorphous layer 4a of second photoelectric conversion layer 4. This layer was formed under the same conditions as p-type amorphous layer 3a of first photoelectric conversion layer 3.

<Step of Forming Buffer Layer $4b_1$>

Next, on p-type amorphous layer 4a, i-type amorphous silicon carbide was formed as buffer layer $4b_1$. This layer was formed under the same conditions as buffer layer 3b of first photoelectric conversion layer 3.

<Step of Forming I-Type Amorphous Layer 4c>

Next, on buffer layer $4b_1$, an i-type amorphous silicon germanium layer was formed as i-type amorphous layer 4c. I-type amorphous layer 4c was formed under the conditions: the temperature of substrate 1 was 200° C.; the pressure in second film deposition chamber 230 of the plasma CVD apparatus was 530 Pa; the power density per unit area of the cathode electrode was 0.01 W/cm$^2$ to 0.3 W/cm$^2$; the gas mixture fed into second film deposition chamber 230 was $GeH_4/(SiH_4+GeH_4)$ of 0.5% to 10%; and the flow ratio, $H_2$ gas/$SiH_4$ gas, was set so that the flow of $H_2$ gas was 10 times as high as the flow of $SiH_4$ gas. This layer was formed to a thickness of 50 nm to 500 nm.

In the present Example, the electric power applied for generating a plasma was supplied intermittently. The frequency was 13.56 MHz, the ON time was 500 μseconds, and the OFF time was varied so that the duty ratio was in a range from 100% (continuous discharge condition) for the sake of comparison to 10%. The duty ratio was set to 10%, 20%, 40%, 50%, and 100%.

<Step of Forming Buffer Layer $4b_2$>

Next, on i-type amorphous layer 4c, i-type amorphous silicon was formed as buffer layer $4b_2$. This layer was formed under the same conditions as buffer layer 3b of first photoelectric conversion layer 3.

<Step of Forming N-Type Semiconductor Layer 4d>

Next, on i-type amorphous layer 4c, an amorphous silicon layer was formed as n-type semiconductor layer 4d. This layer was formed under the same conditions as n-type semiconductor layer 3d of first photoelectric conversion layer 3.

3. Step of Forming Third Photoelectric Conversion Layer 5
<Step of Forming P-Type Microcrystalline Layer 5a>

Next, on n-type semiconductor layer 4d of second photoelectric conversion layer 4, a p-type microcrystalline silicon layer was formed as p-type microcrystalline layer 5a of third photoelectric conversion layer 5. P-type microcrystalline layer 5a was formed under the conditions: the temperature of substrate 1 was 200° C.; the pressure in first film deposition chamber 220 of the plasma CVD apparatus was 1000 Pa; the power density per unit area of the cathode electrode was 0.15 W/cm$^2$; the gas mixture fed into first film deposition chamber 220 was 150 sccm of $SiH_4$ gas and 30 sccm of $B_2H_6$ gas (diluted with hydrogen to 1%); and the flow ratio, $H_2$ gas/$SiH_4$ gas, was set so that the flow of $H_2$ gas was 150 times as high as the flow of $SiH_4$ gas. This layer was formed to a thickness of 40 nm.

<Step of Forming I-Type Microcrystalline Layer 5b>

Next, on p-type microcrystalline layer 5a, an i-type microcrystalline silicon layer was formed as i-type microcrystalline layer 5b. I-type microcrystalline layer 5b was formed under the conditions: the temperature of substrate 1 was 200° C.; the pressure in second film deposition chamber 230 of the plasma CVD apparatus was 2000 Pa; the power density per unit area of the cathode electrode was 0.15 W/cm$^2$; the gas mixture fed into second film deposition chamber 230 was 250 sccm of $SiH_4$ gas; and the flow ratio, $H_2$ gas/$SiH_4$ gas, was set so that the flow of $H_2$ gas was 100 times as high as the flow of $SiH_4$ gas. This layer was formed to a thickness of 2.5 μm.

<Step of Forming N-Type Microcrystalline Layer 5c>

Next, on i-type microcrystalline layer 5b, an n-type microcrystalline silicon layer was formed as n-type microcrystalline layer 5d. N-type microcrystalline layer 5d was formed under the conditions: the temperature of substrate 1 was 200° C.; the pressure in third film deposition chamber 240 of the plasma CVD apparatus was 2000 Pa; the power density per unit area of the cathode electrode was 0.15 W/cm$^2$; the gas mixture fed into third film deposition chamber 240 was 150 sccm of $SiH_4$ gas and 30 sccm of $PH_3$ gas (diluted with hydrogen to 1%); and the flow ratio, $H_2$ gas/$SiH_4$ gas, was set so that the flow of $H_2$ gas was 150 times as high as the flow of $SiH_4$ gas. This layer was formed to a thickness of 40 nm.

<Step of Forming Second Electrode 6>

Next, by means of sputtering, second electrode 6 made up of transparent conductive film 6a of 0.05 μm in thickness and metal film 6b of 0.1 μm in thickness was formed. A stack-type photoelectric conversion device was thus manufactured.

—Characteristics Evaluation 1—

Figure 5:
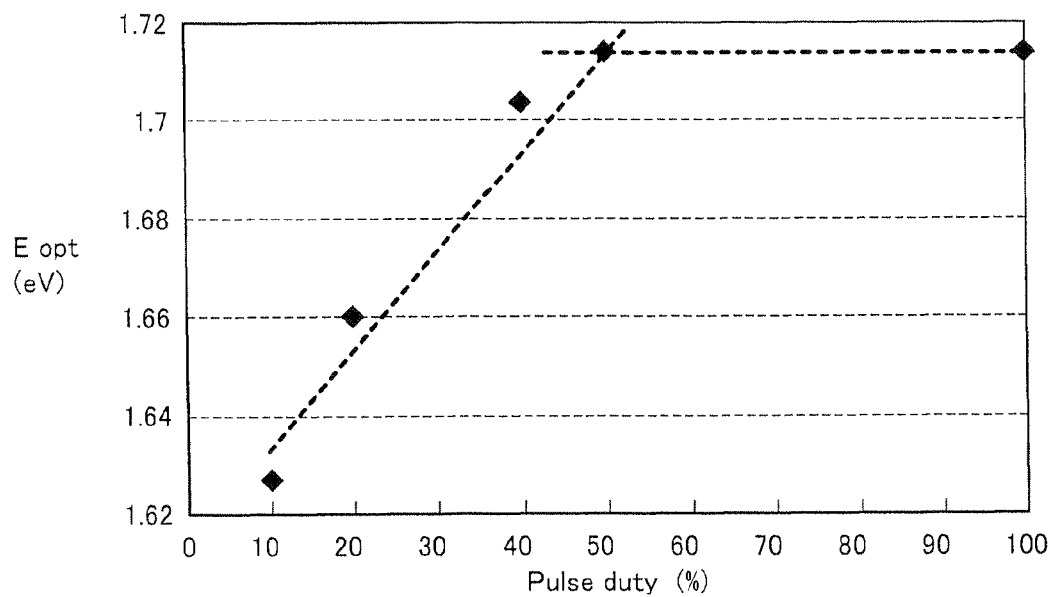
FIG. 5 is a diagram showing a relation between the duty ratio and the bandgap.

Regarding stack-type photoelectric conversion devices formed in the above-described manner with respective duty ratios, the relation between the duty ratio (pulse duty in FIG. 5) and the bandgap (eV) for i-type amorphous layer 4c in the second photoelectric conversion layer was determined as shown in FIG. 5. The bandgap (eV) was determined based on a Tauc plot by measuring the transmittance and the reflectance and calculating the absorption coefficient from the results of the measurement. As shown in FIG. 5, a proportional relation was confirmed between the duty ratio up to 50% and the bandgap. It is therefore seen that the bandgap can be adjusted to a desired bandgap by using the duty ratio.

—Characteristics Evaluation 2—

Figure 6:
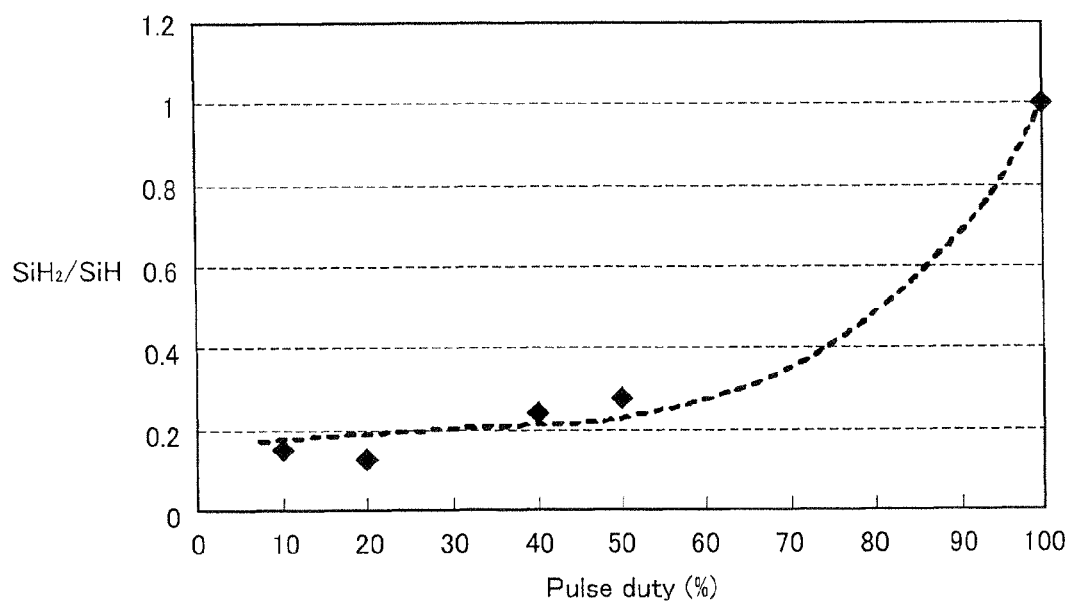
FIG. 6 is a diagram showing a relation between the duty ratio and the $SiH_2$ coupling/SiH coupling ratio of a substrate.

Regarding stack-type photoelectric conversion devices formed in the above-described manner with respective duty ratios, the $SiH_2$ coupling/SiH coupling ratio in i-type amorphous layer 4c of the second photoelectric conversion layer was determined as shown in FIG. 6 based on infrared spectroscopy by measuring the absorbance due to $SiH_2$ and the absorbance due to SiH. As shown in FIG. 6, in the case where the duty ratio is 50% or less, the ratio of $SiH_2$ coupling is low, which indicates that a layer of high quality can be formed.

—Characteristics Evaluation 3—

Figure 7:
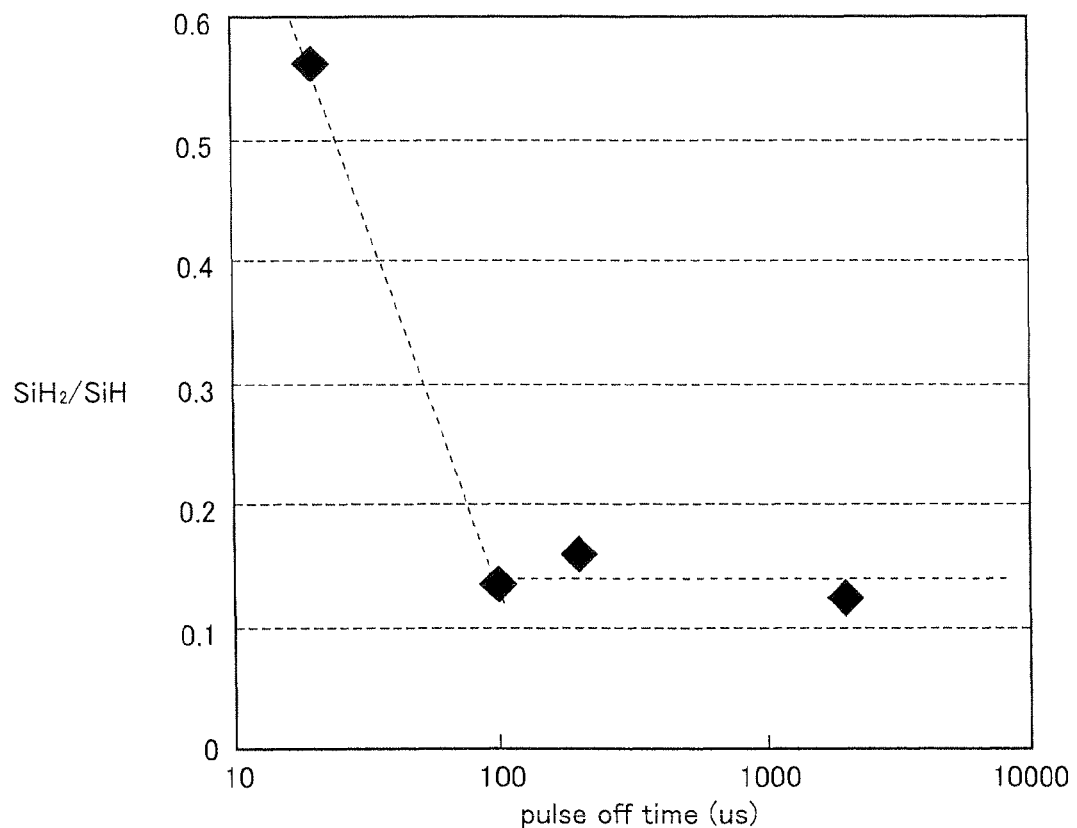
FIG. 7 is a diagram showing a relation between the OFF time of electric power and the $SiH_2$ coupling/SiH coupling ratio of a substrate.

Regarding stack-type photoelectric conversion devices formed in the above-described manner with respective duty ratios, FIG. 7 shows a relation between the OFF time (pulse off time in FIG. 7) and the $SiH_2$ coupling/SiH coupling ratio in the layer. As to FIG. 7, in the photoelectric conversion devices each, i-type amorphous layer 4c was formed under the conditions that the duty ratio was kept constant at 20%, and the OFF time was set to 20 μseconds, 100 μseconds, 200 μseconds, and 2000 μseconds. The values of the $SiH_2$ coupling/SiH coupling ratio were those determined in accordance with Characteristics Evaluation 2. As shown in FIG. 7, in the case where the OFF time is 100 μseconds or more, the $SiH_2$ coupling/SiH coupling ratio is kept at a low value, which indicates that a layer of high quality can stably be formed.

—Characteristics Evaluation 4—

Figure 8:
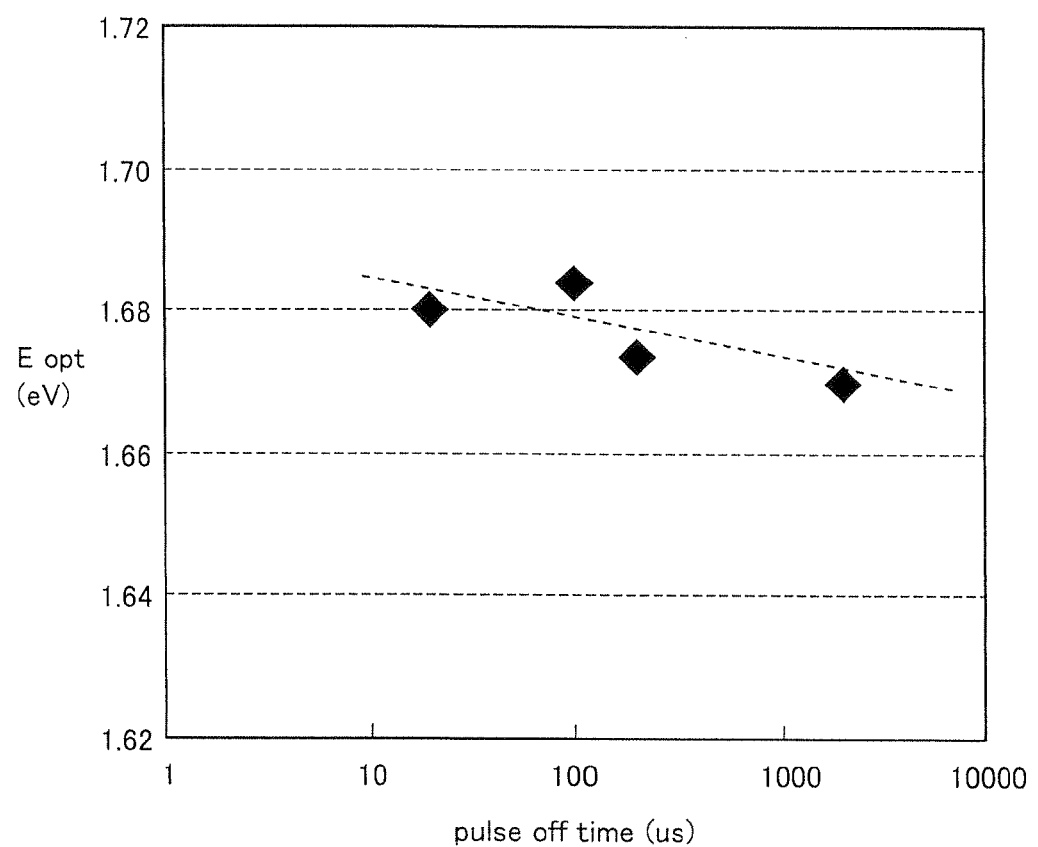
FIG. 8 is a diagram showing a relation between the OFF time of electric power and the bandgap.

Regarding stack-type photoelectric conversion devices formed in the above-described manner with respective duty ratios, FIG. 7 shows a relation between the OFF time (pulse off time in FIG. 8) and the bandgap (eV). In the photoelectric conversion devices, i-type amorphous layer 4c was formed under the conditions that the duty ratio was kept constant at 20%, and the OFF time was set to 20 μseconds, 100 μseconds, 200 μseconds, and 2000 μseconds, similarly to Characteristics Evaluation 3 in FIG. 7. As shown in FIG. 8, the OFF time hardly influences change of the bandgap, which indicates that the duty ratio is important for control of the bandgap as illustrated by above-described Characteristics Evaluation 1.

—Performance Evaluation—

For the stack-type photoelectric conversion device with a light-receiving area of 1 cm$^2$ that had been obtained, current-voltage characteristic photoelectric conversion efficiency was measured under an irradiation condition of AM1.5 (100 mW/cm$^2$). As a result, the stabilization photoelectric conversion efficiency after optical degradation under the duty ratio of 10% or more and 50% or less was 8.2% to 11.4%. In contrast, when the duty ratio was 10%, the stabilization photoelectric conversion efficiency after optical degradation was 7.2%. Here, "after optical degradation" refers to after 1000 hours of irradiation at 50° C. under an irradiation condition of AM1.5 (100 mW/cm$^2$).

It has become clear from this result that a photoelectric conversion device including a semiconductor film formed with the duty ratio varied in a range of 10% or more and 50% or less is superior in photoelectric conversion efficiency to a photoelectric conversion device including a semiconductor film formed with a duty ratio of 100%.

Example 2-Example 14

Photoelectric conversion devices in Examples 2 to 14 were fabricated in a similar manner to the photoelectric conversion device of Example 1 except that the materials constituting first photoelectric conversion layer 3, second photoelectric conversion layer 4, and third photoelectric conversion layer 5 are different as shown in the following Table 3 and Table 4.

TABLE 3

| structure | | Example 2 composition | Example 3 composition | Example 4 composition | Example 5 composition | Example 6 composition | Example 7 composition | Example 8 composition | Example 9 composition |
|---|---|---|---|---|---|---|---|---|---|
| 1st photoelectric conversion layer 3 | p-type amorphous layer 3a | amorphous SiC | amorphous SiC | amorphous SiC | amorphous SiC | amorphous SiC | amorphous SiC | amorphous SiC | amorphous SiC |
| | buffer layer 3b | amorphous SiC | amorphous SiC | amorphous SiC | amorphous SiC | amorphous SiC | amorphous SiC | amorphous SiC | amorphous SiC |
| | i-type amorphous layer 3c | amorphous Si | amorphous Si | amorphous SiC | amorphous Si | amorphous Si | amorphous SiC | amorphous SiC | amorphous Si |
| | n-type semiconductor layer 3d | amorphous Si | amorphous Si | amorphous SiC | amorphous Si | amorphous Si | amorphous SiC | amorphous SiC | amorphous Si |
| 2nd photoelectric conversion layer 4 | p-type amorphous layer 4a | amorphous SiC | amorphous SiC | amorphous SiC | amorphous SiC | amorphous Si | microcrystalline Si | microcrystalline Si | microcrystalline Si |
| | buffer layer $4b_1$ | amorphous SiC | amorphous SiC | amorphous SiC | amorphous SiC | amorphous Si | microcrystalline Si | microcrystalline Si | microcrystalline Si |
| | i-type amorphous layer 4c | amorphous SiGe | amorphous SiGe | amorphous Si | amorphous Si | amorphous SiGe | microcrystalline Si | microcrystalline Si | microcrystalline Si |
| | buffer layer $4b_2$ | amorphous SiC | amorphous SiC | amorphous SiC | amorphous SiC | amorphous SiC | microcrystalline Si | microcrystalline Si | microcrystalline Si |
| | n-type semiconductor layer 4d | amorphous Si | amorphous Si | amorphous Si | amorphous Si | amorphous Si | microcrystalline Si | microcrystalline Si | microcrystalline Si |
| 3rd photoelectric conversion layer 5 | p-type microcrystalline layer 5a | microcrystalline Si | microcrystalline SiGe | microcrystalline SiGe | amorphous SiGe | microcrystalline Si | amorphous SiGe | microcrystalline SiGe | microcrystalline SiGe |
| | i-type microcrystalline layer 5b | microcrystalline Si | microcrystalline SiGe | microcrystalline SiGe | amorphous SiGe | microcrystalline Si | amorphous SiGe | microcrystalline SiGe | microcrystalline SiGe |
| | n-type microcrystalline layer 5c | microcrystalline Si | microcrystalline SiGe | microcrystalline SiGe | amorphous SiGe | microcrystalline Si | amorphous SiGe | microcrystalline SiGe | microcrystalline SiGe |

TABLE 4

| | structure | Example 10 composition | Example 11 composition | Example 12 composition | Example 13 composition | Example 14 composition |
|---|---|---|---|---|---|---|
| 1st photoelectric conversion layer 3 | p-type amorphous layer 3a | amorphous SiO | amorphous SiO | amorphous SiO | amorphous SiO | amorphous SiO |
| | buffer layer 3b | amorphous SiO | amorphous SiO | amorphous SiO | amorphous SiO | amorphous SiO |
| | i-type amorphous layer 3c | amorphous SiO | amorphous SiO | amorphous SiO | amorphous SiO | amorphous SiO |
| | n-type semiconductor layer 3d | amorphous SiO | amorphous SiO | amorphous SiO | amorphous SiO | amorphous SiO |
| 2nd photoelectric conversion layer 4 | p-type amorphous layer 4a | amorphous SiC | amorphous SiC | amorphous SiC | amorphous SiC | microcrystalline Si |
| | buffer layer $4b_1$ | amorphous SiC | amorphous SiC | amorphous SiC | amorphous SiC | microcrystalline Si |
| | i-type amorphous layer 4c | amorphous SiGe | amorphous SiGe | amorphous Si | amorphous Si | microcrystalline Si |
| | buffer layer $4b_2$ | amorphous SiGe | amorphous SiGe | amorphous Si | amorphous Si | microcrystalline Si |
| | n-type semiconductor layer 4d | amorphous SiGe | amorphous SiGe | amorphous Si | amorphous Si | microcrystalline Si |
| 3rd photoelectric conversion layer 5 | p-type microcrystalline layer 5a | microcrystalline Si | microcrystalline SiGe | microcrystalline SiGe | amorphous SiGe | microcrystalline SiGe |
| | i-type microcrystalline layer 5b | microcrystalline Si | microcrystalline SiGe | microcrystalline SiGe | amorphous SiGe | microcrystalline SiGe |
| | n-type microcrystalline layer 5c | microcrystalline Si | microcrystalline SiGe | microcrystalline SiGe | amorphous SiGe | microcrystalline SiGe |

Example 15-Example 20

Photoelectric conversion devices in Examples 15 to 20 were fabricated in a similar manner to the photoelectric conversion device of Example 1 except that third photoelectric conversion layer 5 was not formed and the materials constituting first photoelectric conversion layer 3 and second photoelectric conversion layer 4 are different as shown in the following Table 5.

TABLE 5

| structure | | Example 15 composition | Example 16 composition | Example 17 composition | Example 18 composition | Example 19 composition | Example 20 composition |
|---|---|---|---|---|---|---|---|
| substrate 1 | | glass | glass | glass | glass | glass | glass |
| 1st electrode 2 | | $SnO_2$ | $SnO_2$ | $SnO_2$ | $SnO_2$ | $SnO_2$ | $SnO_2$ |
| 1st photoelectric conversion layer 3 | p-type amorphous layer 3a | amorphous SiC | amorphous SiC | amorphous SiC | amorphous SiC | amorphous SiC | amorphous SiC |
| | buffer layer 3b | amorphous SiC | amorphous SiC | amorphous SiC | amorphous SiC | amorphous SiC | amorphous SiC |
| | i-type amorphous layer 3c | amorphous Si | amorphous SiGe | amorphous SiC | amorphous SiO | amorphous SiGe | amorphous SiGe |
| | n-type semiconductor layer 3d | amorphous Si | amorphous SiGe | amorphous SiC | amorphous SiO | amorphous SiGe | amorphous SiGe |
| 2nd photoelectric conversion layer 4 | p-type amorphous layer 4a | amorphous SiGe | microcrystalline Si | microcrystalline SiGe | amorphous SiGe | microcrystalline SiGe | amorphous SiGe |
| | buffer layer $4b_1$ | amorphous SiGe | microcrystalline Si | microcrystalline SiGe | amorphous SiGe | microcrystalline SiGe | amorphous SiGe |
| | i-type amorphous layer 4c | amorphous SiGe | microcrystalline Si | microcrystalline SiGe | amorphous SiGe | microcrystalline SiGe | amorphous SiGe |
| | buffer layer $4b_2$ | amorphous SiC | microcrystalline Si | microcrystalline SiGe | amorphous SiC | microcrystalline SiGe | amorphous SiC |
| | n-type semiconductor layer 4d | amorphous Si | microcrystalline Si | microcrystalline Si | amorphous Si | microcrystalline Si | amorphous Si |
| 2nd electrode 6 | transparent conductive film 6a | ZnO | ZnO | ZnO | ZnO | ZnO | ZnO |
| | metal film 6b | Ag | Ag | Ag | Ag | Ag | Ag |

<Performance Evaluation>

For the photoelectric conversion devices of Examples 2 to 20, current-voltage characteristic photoelectric conversion efficiency was measured under an irradiation condition of AM1.5 (100 mW/cm$^2$). As a result, the stabilization photoelectric conversion efficiency after optical degradation under the duty ratio of 10% or more and 50% or less was 8.2% to 11.4%. It has become clear from this result that a photoelectric conversion device including a semiconductor film formed with the duty ratio varied in a range of 10% or more and 50% or less is superior in photoelectric conversion efficiency.

While the description has been given of the embodiments and Examples of the technology disclosed herein, it is intended from the beginning that the configurations of the embodiments and Examples may be combined as appropriate.

It should be construed that embodiments and examples disclosed herein are by way of illustration in all respects, not by way of limitation. It is intended that the scope of the technology disclosed herein is defined by claims, not by the description above, and encompasses all modifications and variations equivalent in meaning and scope to the claims.

INDUSTRIAL APPLICABILITY

The method for forming a film of the technology disclosed herein is not limited to one step in the process for a photoelectric conversion device, but applicable to a method for manufacturing a semiconductor device that requires bandgap regulation.

REFERENCE SIGNS LIST

100, 400 photoelectric conversion device; 1 substrate; 2 first electrode; 3 first photoelectric conversion layer; 3a, 4a, 7a p-type amorphous layer; 3b, $4b_1$, $4b_2$, $7b_1$, $7b_2$ buffer layer; 3c, 4c, 7c i-type amorphous layer; 3d, 4d, 7d n-type semiconductor layer; 4, 7 second photoelectric conversion layer; 5 third photoelectric conversion layer; 5a p-type microcrystalline layer; 5b i-type microcrystal layer; 5c n-type microcrystalline layer; 6 second electrode; 6a transparent conductive film; 6b metal film; 8 gate valve; 205 impedance matching circuit; 206 gas exhaust unit; 207 pressure regulation valve; 208 electric power supply unit; 208a electric power feed line; 208b electric power feed line; 209 gas exhaust outlet; 211 gas feed unit; 212 gas; 220 first film deposition chamber; 230 second film deposition chamber; 240 third film deposition chamber; 222, 232, 242 cathode electrode; 223, 233, 243 anode electrode

The invention claimed is:

1. A method for manufacturing a photoelectric conversion device including the step of manufacturing a semiconductor film by a plasma CVD method,
    said semiconductor film including an amorphous film of an SiGe-based compound or a microcrystalline film of an SiGe-based compound,
    said plasma CVD method varying an ON time or an OFF time of electric power which is applied to generate a plasma along a thickness direction of the semiconductor film and intermittently supplying the electric power, and
    the ON time and the OFF time of said electric power being varied in a range in which a duty ratio represented by ON time/(ON time+OFF time)×100(%) satisfies a duty ratio of not less than 10% and not more than 50%.

2. The method for manufacturing a photoelectric conversion device according to claim 1, wherein
    said photoelectric conversion device includes a photoelectric conversion layer in which a semiconductor film of a first conductivity type, a substantially intrinsic semiconductor film, and a semiconductor film of a second conductivity type opposite to said first conductivity type are stacked, and
    said substantially intrinsic semiconductor film is an amorphous film of an SiGe-based compound or a microcrystalline film of an SiGe-based compound manufactured by said plasma CVD method.

3. A method for manufacturing a photoelectric conversion device including a plurality of photoelectric conversion layers each having a semiconductor film of a first conductivity type, a substantially intrinsic semiconductor film, and a semiconductor film of a second conductivity type opposite to said first conductivity type that are stacked, said method for manufacturing including the step of manufacturing said semiconductor films by a plasma CVD method, respective substantially intrinsic semiconductor films in two photoelectric conversion layers selected from the plurality of photoelectric conversion layers being an amorphous film of an SiGe-based compound or a microcrystalline film of an SiGe-based compound manufactured by said plasma CVD method, said plasma CVD method varying an ON time or an OFF time of electric power which is applied to generate a plasma along a thickness direction of the semiconductor films and intermittently supplying the electric power, and the ON time and the OFF time of said electric power being varied in a range in which a duty ratio represented by ON time/(ON time+OFF time)×100(%) satisfies a duty ratio of not less than 10% and not more than 50%.

4. The method for manufacturing a photoelectric conversion device according to claim 3, wherein the substantially intrinsic semiconductor film in one of said two photoelectric conversion layers that is located on a light incident side is formed by intermittently supplying electric power with said duty ratio higher than that for the substantially intrinsic semiconductor film in the other photoelectric conversion layer.

5. The method for manufacturing a photoelectric conversion device according to claim 1, wherein the OFF time of said intermittently supplied electric power is not less than 100 μsec.

* * * * *